United States Patent
Walder

(10) Patent No.: US 11,255,916 B2
(45) Date of Patent: Feb. 22, 2022

(54) METHOD AND DEVICE FOR MONITORING A STABLE CONVERGENCE BEHAVIOR OF A KALMAN FILTER

(71) Applicant: INVENOX GMBH, Garching (DE)

(72) Inventor: Georg Walder, Munich (DE)

(73) Assignee: INVENOX GMBH, Garching (DE)

( * ) Notice: Subject to any disclaimer, the term of this patent is extended or adjusted under 35 U.S.C. 154(b) by 0 days.

(21) Appl. No.: 16/632,457

(22) PCT Filed: Jul. 24, 2018

(86) PCT No.: PCT/EP2018/070030
§ 371 (c)(1),
(2) Date: Jan. 20, 2020

(87) PCT Pub. No.: WO2019/020620
PCT Pub. Date: Jan. 31, 2019

(65) Prior Publication Data
US 2020/0166577 A1 May 28, 2020

(30) Foreign Application Priority Data
Jul. 26, 2017 (EP) .................................... 17183313

(51) Int. Cl.
*G01R 31/367* (2019.01)
*G01R 31/3842* (2019.01)
(Continued)

(52) U.S. Cl.
CPC ......... *G01R 31/367* (2019.01); *G01R 31/374* (2019.01); *G01R 31/3842* (2019.01);
(Continued)

(58) Field of Classification Search
CPC .................................................. G01R 31/3648
See application file for complete search history.

(56) References Cited

U.S. PATENT DOCUMENTS

2009/0228225 A1* 9/2009 Burgess ............... G01R 31/367
 702/63
2016/0116542 A1 4/2016 Baba et al.
(Continued)

FOREIGN PATENT DOCUMENTS

DE 102015202514 A1 8/2015
EP 1231475 A2 8/2002
(Continued)

OTHER PUBLICATIONS

Barillas et al., "A comparative study and validation of state estimation algorithms for Li-ion batteries in battery management systems" Applied Energy 155 (2015) 455-462 (Year: 2015).*
(Continued)

*Primary Examiner* — John C Kuan
(74) *Attorney, Agent, or Firm* — Maginot, Moore & Beck, LLP

(57) ABSTRACT

Method for monitoring a stable convergence behaviour of a Kalman filter (KF), which estimates states and/or parameters of an energy storage system, in particular a battery cell (BZ), wherein a covariance behaviour—provided by the Kalman filter (KF)—in terms of at least one state and/or parameter of the energy storage system is compared with a corresponding desired covariance behaviour of the state and/or parameter, wherein the Kalman filter (KF) is automatically deactivated for each state and/or each parameter of the energy storage system, of which the covariance behaviour exceeds the corresponding desired covariance behaviour.

13 Claims, 16 Drawing Sheets

(51) Int. Cl.
*G01R 31/36* (2020.01)
*G06F 17/00* (2019.01)
*G06F 17/18* (2006.01)
*G01R 31/374* (2019.01)
*H03H 17/02* (2006.01)

(52) U.S. Cl.
CPC ..... *H03H 17/0257* (2013.01); *G01R 31/3648* (2013.01); *G06F 17/00* (2013.01); *G06F 17/18* (2013.01)

(56) References Cited

U.S. PATENT DOCUMENTS

2018/0024200 A1* 1/2018 Hiwa ................ G01R 31/3842 702/63
2018/0313904 A1* 11/2018 Heiries ................ G01R 31/389

FOREIGN PATENT DOCUMENTS

| JP | 2013-72677 A | 4/2013 |
| JP | 2015-105876 A | 6/2015 |
| JP | 2015-184217 A | 10/2015 |
| JP | 2016-224022 A | 12/2016 |
| JP | 2018-151176 A | 9/2018 |
| WO | 2012/098968 A1 | 7/2012 |
| WO | 2016/129248 A1 | 8/2016 |

OTHER PUBLICATIONS

Campestrini et al., "A comparative study and review of different Kalman filters by applying an enhanced validation method" Journal of Energy Storage 8 (2016) 142-159 (Year: 2016).*

Xiong et al., "Evaluation on State of Charge Estimation of Batteries With Adaptive Extended Kalman Filter by Experiment Approach" IEEE Transactions on Vehicular Technology, vol. 62, No. 1, Jan. 2013 (Year: 2013).*

Waldner, Georg, et al., "Adaptive State and Parameter Estimation of Lithium-Ion Batteries Based on a Dual Linear Kalman Filter," The Second International Conference on Technological Advances in Electrical, Electronics and Computer Engineering. (9 pages), (2014).

Notification of Reasons for Refusal corresponding to Japanese Patent Application No. 2020-526677, dated Jun. 25, 2021 (18 pages).

Chinese First Office Action corresponding to Chinese Patent Application No. 201880050895.6 dated Sep. 3, 2021 (12 pages).

* cited by examiner

METHOD AND DEVICE FOR MONITORING A STABLE CONVERGENCE BEHAVIOR OF A KALMAN FILTER

This application is a 35 U.S.C. 371 National Stage application of PCT/EP2018/070030, filed Jul. 24, 2018, and claims priority to European Application No. EP 17183313.0 filed on Jul. 26, 2017. The entire contents of the above-mentioned patent applications are incorporated herein by reference as part of the disclosure of this U.S. application.

BACKGROUND

The invention relates to a method and a device for monitoring a stable convergence behaviour of a Kalman filter, which estimates states and/or parameters of an energy storage system, in particular a battery cell.

Battery management systems serve to ensure optimal usage of energy stored in an energy store or battery. Battery management systems also serve principally to protect a battery from damage, e.g. owing to a charging procedure being carried out too quickly. Battery management systems comprise electronic closed-loop control circuits which monitor and control the charging and discharging of rechargeable batteries and batteries. Battery management systems can be provided e.g. in electric vehicles or photovoltaic installations in order to use the electrical energy stores and to protect them from damage in an optimal manner. Conventional battery management systems partially use Kalman filters to estimate the state of batteries. A battery has at least one battery cell. The behaviour of the battery cell is replicated with the aid of a battery model. The dynamic behaviour of a battery can be replicated with the aid of an electrical equivalent circuit diagram. Furthermore, the modelling of the battery can be effected e.g. by means of a so-called Blackbox model.

FIG. 1 shows e.g. an electrical equivalent circuit diagram of a lithium-ion battery cell and an associated impedance progression of the components contained in the equivalent circuit. The equivalent circuit illustrated in FIG. 1 therefore forms a battery model of the battery cell with which the behaviour of the battery cell, e.g. a frequency behaviour, can be determined. In the battery model according to FIG. 1, an inductance L, an internal resistance $R_i$, a capacitance such as a diffusion capacitance are connected between two connection terminals. With varying frequency, the imaginary part and the real part of the complex impedance Z of the equivalent circuit or of the battery model changes. Since the number of components in the equivalent circuit also specifies the number of necessary states of the system, simplifications are effected in the case of conventional battery models. For example, equivalent circuits are used which include only the internal resistance $R_i$, a combination of the internal resistance $R_i$ with a combined RC member or an internal resistance $R_i$ with a first RC member for modelling kHz frequency range and a further RC member for modelling the Hz frequency range.

Conventional battery models BM permit only the estimation of states, e.g. of a state of charge SoC of a battery cell. Battery cell parameters, e.g. an internal resistance or a battery cell capacitance are widely assumed to be constant and so no dynamic changes in the battery cell parameters are taken into consideration. Consequently, in the case of conventional approaches the battery cell parameters of the battery cell cannot be observed. For example, in the case of the conventional approach the change in a battery cell parameter, e.g. the internal resistance of the battery cell, cannot be detected or requires complex measurement. A reason for this resides primarily in the non-deterministic behaviour of the adaptive system. This can result in the conventional battery management system diverging and becoming unstable after an indefinite period of time.

A Kalman filter KF can be used to estimate states and/or parameters of an energy storage system, e.g. a battery cell. However, this Kalman filter KF must not operate in an unstable manner.

SUMMARY OF THE DISCLOSURE

Therefore, it is an object of the present invention to provide a method and a device which render it possible to monitor the stability of a Kalman filter.

The invention accordingly provides a method for monitoring a stable convergence behaviour of a Kalman filter, which estimates states and/or parameters of an energy storage system, in particular a battery cell, wherein a covariance behaviour—provided by the Kalman filter—in terms of at least one state and/or parameter of the energy storage system is compared with a corresponding desired covariance behaviour of the state and/or parameter, wherein the Kalman filter is automatically deactivated for each state and/or each parameter of the energy storage system, of which the covariance behaviour exceeds the corresponding desired covariance behaviour.

According to a further aspect, the invention provides a method for detecting battery cell states and battery cell parameters of at least one battery cell, comprising the steps of:

determining noise components of a state estimator of a dual Kalman filter and determining noise components of a parameter estimator of the dual Kalman filter on the basis of a characteristic parameter behaviour of the battery cell in relation to at least one battery cell characteristic variable of the battery cell, and adapting the battery cell states and the battery cell parameters to a specified battery model of the battery cell by means of the dual Kalman filter on the basis of the determined noise components.

In one possible embodiment, by means of the method in accordance with the invention, determined noise components are used for adapting or estimating the battery cell states and the battery cell parameters. This permits dynamic and adaptive estimation of the battery cell states and/or the battery cell parameters. The dual Kalman filter is thus tuned or adjusted on the basis of measurable noise components.

In the case of one possible embodiment of the method in accordance with the invention, the battery cell states include a state of charge of the battery cell and/or dynamic battery cell states, in particular a diffusion voltage of the battery cell.

In the case of one possible embodiment of the method in accordance with the invention, the battery cell parameters include an internal resistance of the battery cell, a rated capacitance of the battery cell and/or resistive dynamic components, in particular a diffusion resistance of the battery cell and/or capacitive dynamic components, in particular a diffusion capacitance of the battery cell.

In the case of one possible embodiment of the method in accordance with the invention, the battery cells have characteristic variables of the battery cell, a loading characteristic variable of the battery cell, a temperature of the battery cell and/or an ageing characteristic variable of the battery cell.

In the case of a further possible embodiment of the method in accordance with the invention, the determined noise components have a process noise and/or a measurement noise.

In the case of one possible embodiment of the method in accordance with the invention, the process noise includes a process noise of the battery cell states and/or a process noise of the battery cell parameters.

In the case of a further possible embodiment of the method in accordance with the invention, a state vector of the state estimator of the dual Kalman filter includes the battery cell states of the battery cell and a state vector of the parameter estimator of the dual Kalman filter has the battery cell parameters of the battery cell.

In the case of a further possible embodiment of the method in accordance with the invention, a loading of the battery cell is controlled on the basis of the detected battery cell states and the detected battery cell parameters.

In the case of a further possible embodiment of the method in accordance with the invention, the battery cell states of the battery cell which are adapted by the state estimator of the dual Kalman filter and the battery cell parameters of the battery cell which are adapted by the parameter estimator of the dual Kalman filter are output to a control unit for controlling a load connected to the battery cell and/or for controlling a current source connected to the battery cell.

The connected load can be e.g. an electric motor.

In the case of a further possible embodiment of the method in accordance with the invention, the characteristic parameter behaviour of the battery cell is read out from a data store.

In the case of a further possible embodiment of the method in accordance with the invention, the characteristic parameter behaviour of the battery cell indicates for each battery cell parameter its average value and/or variance in relation to each battery cell state and/or on the basis of measurement variables of the battery cell detected by means of sensors.

In the case of a further possible embodiment of the method in accordance with the invention, the stored characteristic parameter behaviour of the battery cell is determined on the basis of measurement variables detected by means of sensors.

In the case of one possible embodiment of the method in accordance with the invention, the measurement variables detected by means of sensors include a terminal current, a terminal voltage and/or a temperature of the relevant battery cell.

In the case of a further possible embodiment of the method in accordance with the invention, a process noise of a battery cell parameter is determined in dependence upon its read-out characteristic parameter behaviour in relation to a battery cell state and/or on the basis of measurement variables detected by means of sensors, and in dependence upon a change in this battery cell state over time and/or on the basis of measurement variables detected by means of sensors.

In the case of a further possible embodiment of the method in accordance with the invention, a process noise of a battery cell state is determined in dependence upon its read-out parameter behaviour in relation to at least one battery cell parameter.

In the case of a further possible embodiment of the method in accordance with the invention, for each measurement variable detected by means of sensors, its measurement variable noise is calculated on the basis of an average value and/or a variance of a noise behaviour of the corresponding measurement variable sensor in relation to the measurement variable which is read out from a data store.

In the case of a further possible embodiment of the method in accordance with the invention, the calculated measurement variable noise of all measurement variables is summed in order to determine the measurement noise.

In the case of a further possible embodiment of the method in accordance with the invention, a stability of the dual Kalman filter is monitored and the adaptation of the respective battery cell states by the state estimator of the dual Kalman filter, and the adaptation of the respective battery cell parameters by the parameter estimator of the dual Kalman filter is suspended as soon as a threat of instability of the dual Kalman filter is recognised.

In the case of a further possible embodiment of the method in accordance with the invention, the stability of the dual Kalman filter is monitored on the basis of a covariance behaviour of the battery cell states and on the basis of a covariance behaviour of the battery cell parameters.

In the case of a further possible embodiment of the method in accordance with the invention, the covariance behaviour of a battery cell state and/or the covariance behaviour of a battery cell parameter of the dual Kalman filter is compared with an associated stored desired covariance behaviour.

In the case of a further possible embodiment of the method in accordance with the invention, the adaptation of a battery cell state by the state estimator of the dual Kalman filter is suspended as soon as its covariance behaviour exceeds the stored associated desired covariance behaviour of the respective battery cell state.

Furthermore, In the case of one possible embodiment of the method in accordance with the invention, the adaptation of a battery cell parameter by the parameter estimator of the dual Kalman filter is suspended as soon as its covariance behaviour exceeds the stored associated desired covariance behaviour of the respective battery cell parameter.

In the case of a further possible embodiment of the method in accordance with the invention, the stored desired covariance behaviour includes a funnel function which decreases exponentially over time and of which the coefficients are configured.

According to a further aspect, the invention provides a device for detecting battery cell states and/or battery cell parameters of at least one battery cell, comprising:

a dual Kalman filter which has a state estimator for estimating battery cell states and a parameter estimator for estimating battery cell parameters, and comprising a determination unit which is suitable for determining noise components of the state estimator and the parameter estimator on the basis of a stored characteristic parameter behaviour of the battery cell, wherein the battery cell states and the battery cell parameters can be adapted automatically to a specified battery model of the battery cell by means of the dual Kalman filter on the basis of the noise components determined by the determination unit.

In the case of one possible embodiment of the device in accordance with the invention, the state estimator of the dual Kalman filter is formed by a first Kalman filter and the parameter estimator of the dual Kalman filter is formed by a second Kalman filter.

In the case of one possible embodiment of the device in accordance with the invention, the two Kalman filters of the dual Kalman filter each have a linear Kalman filter, an extended Kalman filter, an unscented Kalman filter, a square-root unscented Kalman filter or a central-difference Kalman filter. In the case of a further possible embodiment of the device in accordance with the invention, the battery cell states which are adapted by the state estimator of the dual Kalman filter and the battery cell parameters of the battery cell which are adapted by the parameter estimator of the dual Kalman filter are output to a control unit which is provided for controlling a load, in particular an electric motor, connected to the battery cell and/or for controlling a current source connected to the battery cell.

In the case of one embodiment of the device in accordance with the invention, the dual Kalman filter is monitored in terms of its stability by an integrated stability monitoring unit.

In the case of a further possible embodiment of the device in accordance with the invention, the battery cell has battery cell sensors provided thereon which detect the measurement variables of the battery cell by means of sensors.

In the case of a further possible embodiment of the device in accordance with the invention, the battery cell sensors have a sensor for detecting a terminal voltage of the battery cell, a sensor for detecting a terminal current of the battery cell and a temperature sensor for detecting a temperature of the battery cell.

In the case of a further possible embodiment of the device in accordance with the invention, the dual Kalman filter receives, on the input side, the measurement variables detected by means of sensors by means of the battery cell sensors.

DESCRIPTION OF THE DRAWINGS

Possible embodiments of the various aspects of the invention will be explained in greater detail hereinafter with reference to the enclosed figures.

In the figures.

DETAILED DESCRIPTION

Figure 2:
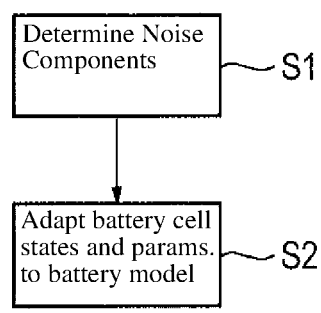
FIG. 2 shows a simple flow diagram to illustrate one possible exemplified embodiment of a method in accordance with the invention for detecting battery cell states and battery cell parameters of at least one battery cell according to one aspect of the present invention.

As can be seen in FIG. 2, a method for detecting battery cell states BZZ and battery cell parameters BZP according to one aspect of the invention comprises essentially two steps.

In a first step S1, noise components n, v of a state estimator of a dual Kalman filter and noise components n, v of a parameter estimator of the dual Kalman filter are determined on the basis of a characteristic parameter behaviour of a battery cell in relation to at least one battery cell characteristic variable BZK of the battery cell BZ.

In a further step S2, battery cell states BZZ and battery cell parameters BZP are adapted to a specified battery model BM of the battery cell BZ by means of the dual Kalman filter on the basis of the noise components n, v determined in step S1.

In the case of one possible embodiment, the noise components n, v determined in step S1 include a process noise v and a measurement noise n. The determined process noise v can include a process noise $v_{BZZ}$ of the battery cell states BZZ and/or a process noise $v_{BZP}$ of the battery cell parameters BZP.

Figure 1:
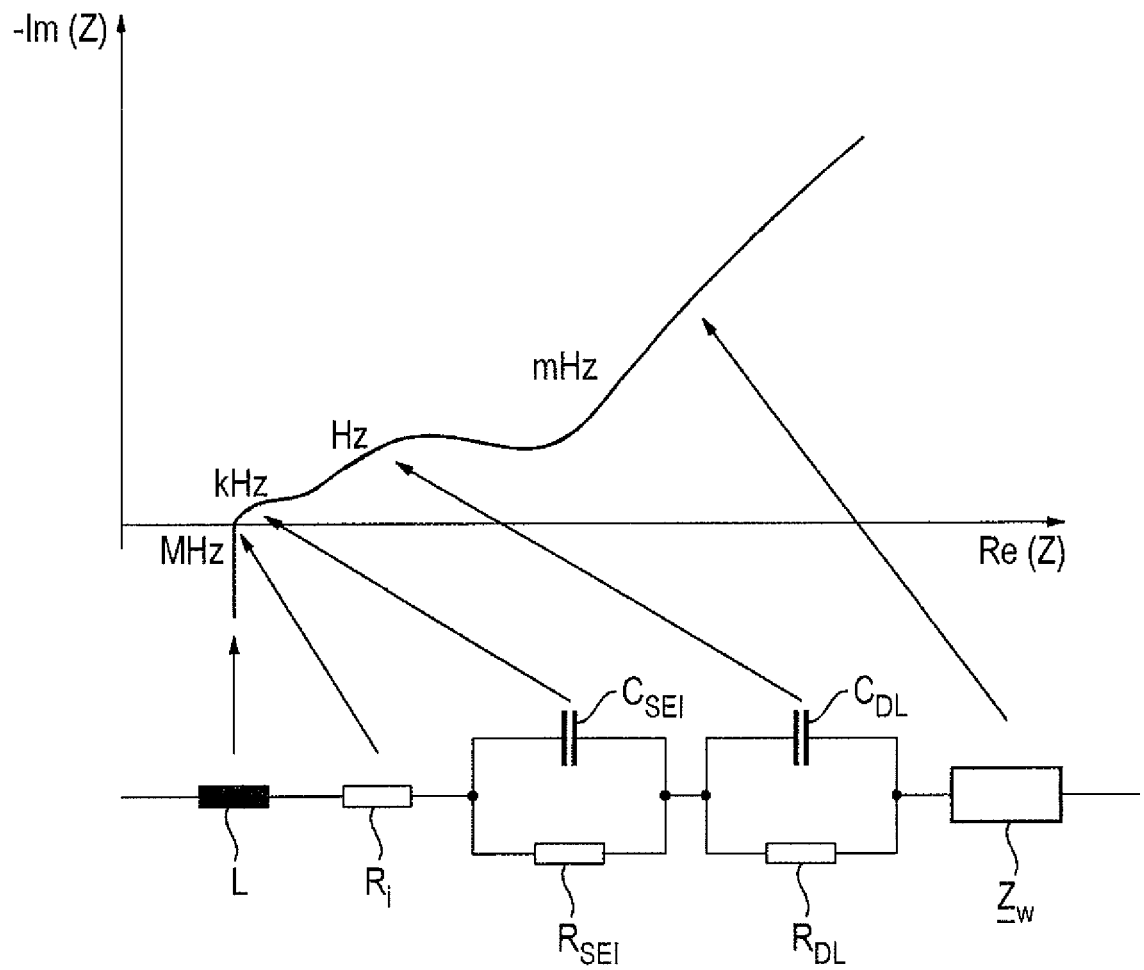
FIG. 1 shows an electrical equivalent circuit for a battery cell, as can be used in the case of a conventional battery management system.

The dual Kalman filter DKF used in the case of the method as shown in FIG. 1 has two Kalman filters KF coupled together, wherein a first Kalman filter is used as a state estimator and a second Kalman filter is used as a parameter estimator. A state vector of the state estimator of the dual Kalman filter DKF includes the battery cell states $x_{BZZ}$ of the battery cell BZ. A state vector of the parameter estimator of the dual Kalman filter DKF includes the battery cell parameters $x_{BZP}$ of the battery cell BZ. In the case of one possible embodiment, the characteristic parameter behaviour of the battery cell BZ as used in step S1 is read out from a data store. In the case of one possible embodiment, the characteristic parameter behaviour of the battery cell BZ includes, for each battery cell parameter BZP, its average value $\mu_{BZP}$ and/or its variance $\sigma_{BZP}$ in relation to each battery cell state BZZ of the battery cell BZ. In the case of one embodiment, the stored characteristic parameter behaviour of the battery cell BZ can be determined on the basis of measurement variables MG determined by means of sensors. These measurement variables MG include e.g. a terminal current $I_{KL}$, a terminal voltage $U_{KL}$ and/or a temperature of the battery cell BZ.

In the case of one possible embodiment, in step S1 a process noise $v_{BZP}$ of a battery cell parameter BZP is determined in dependence upon its read-out characteristic parameter behaviour in relation to a battery cell state BZZ and/or on the basis of measurement variables MG detected by means of sensors in dependence upon a change in the battery cell state BZZ over time and/or on the basis of measurement variables MG detected by means of sensors.

In the case of one possible embodiment, the battery cell states BZZ of the battery cell BZ include a state of charge SOC of the battery cell and/or dynamic battery cell states BZZ, in particular a diffusion voltage $U_d$ of the battery cell BZ. The state of charge SOC of the battery cell BZ is between 0 and 1 or between 0 and 100%. The diffusion voltage $U_d$ is the particular voltage in a battery model BM which is illustrated e.g. in FIG. 6 which decreases over the RC member and thereby demonstrates a dynamic behaviour. The battery cell states BZZ are the particular physical variables of the battery model BM which also occur as states in differential equations.

In one possible embodiment, the battery cell parameters BZP of the battery cell BZ include an internal resistance $R_i$ of the battery cell, a rated capacitance $C_n$ of the battery cell Bz and resistive dynamic components, in particular a diffusion resistance $R_d$ of the battery cell and/or capacitive dynamic components, in particular a diffusion capacitance $C_D$ of the battery cell BZ. The battery cell parameters BZP include the particular physical variables of the battery model BM which occur as parameters or a value in the differential equations. The rated capacitance $C_n$ forms a battery cell parameter BZP and indicates the present capacitance of the battery cell based upon the present influence variables. The diffusion resistance $R_d$ likewise represents a battery cell parameter BZP and indicates the resistance component of the dynamic RC component of the battery model BM used, which is illustrated by way of example in FIG. 6. The diffusion capacitance $C_D$ of the battery cell BZ likewise forms a battery cell parameter BZP and represents the capacitive component of the dynamic RC component within the battery model shown in FIG. 6.

In one possible embodiment, the battery cell characteristic variables BZK of the battery cell BZ include a loading characteristic variable of the battery cell BZ, a temperature T of the battery cell BZ and/or an ageing characteristic variable of the battery cell BZ. An example of a loading variable of the battery cell BZ which is used as the battery cell characteristic variable BZK is the so-called C-rate. The C-rate is the loading multiple of the rated capacitance and describes the loading of the battery cell BZ. For example, in the case of a capacitance of the battery cell BZ of 1 Ah, 1C denotes a loading of 1A. For example, cycle numbers or characteristic variables in terms of the ageing of the battery cell can be used as ageing characteristic variables of the battery cell BZ.

In the case of one possible embodiment, the noise components n, v used in step S1 include a process noise v and/or a measurement noise n. In one possible embodiment, the process noise can include a process noise $v_{BZZ}$ of the various battery cell states BZZ and/or a process noise $v_{BZP}$ of the various battery cell parameters BZP. In the case of one possible embodiment, the process noise includes a process noise of a state of charge SOL of the battery cell BZ and/or a process noise of a diffusion voltage $U_d$ of the battery cell BZ. Furthermore, the process noise can also include a process noise $v_{BZP}$ of various battery cell parameters BZP, e.g. an internal resistance of the battery cell BZ, a rated capacitance $C_N$ of the battery cell BZ, a diffusion resistance $R_d$ of the battery cell BZ and/or a diffusion capacitance $C_D$ of the battery cell BZ.

The process noise $v_{BZP}$ of the battery cell parameter BZP is determined in dependence upon its read-out characteristic parameter behaviour in relation to a battery cell state BZZ. Alternatively, the process noise can also be determined on the basis of measurement variables MG detected by means of sensors, and in dependence upon a change in a battery cell state BZZ over time. The process noise $v_{BZZ}$ of a battery cell state BZZ is determined in dependence upon its read-out parameter behaviour in relation to at least one battery cell parameter BZP. In the case of one possible embodiment of the method in accordance with the invention, for each measurement variable MG detected by means of sensors, its measurement variable noise is calculated on the basis of an average value $\mu_{MG}$ and/or a variance $\sigma_{MG}$ of a noise behaviour of the corresponding measurement variable sensor in relation to the measurement variable MG. The calculated measurement variable noise of all measurement variables can be summed in order to determine the measurement noise n.

Figure 3:
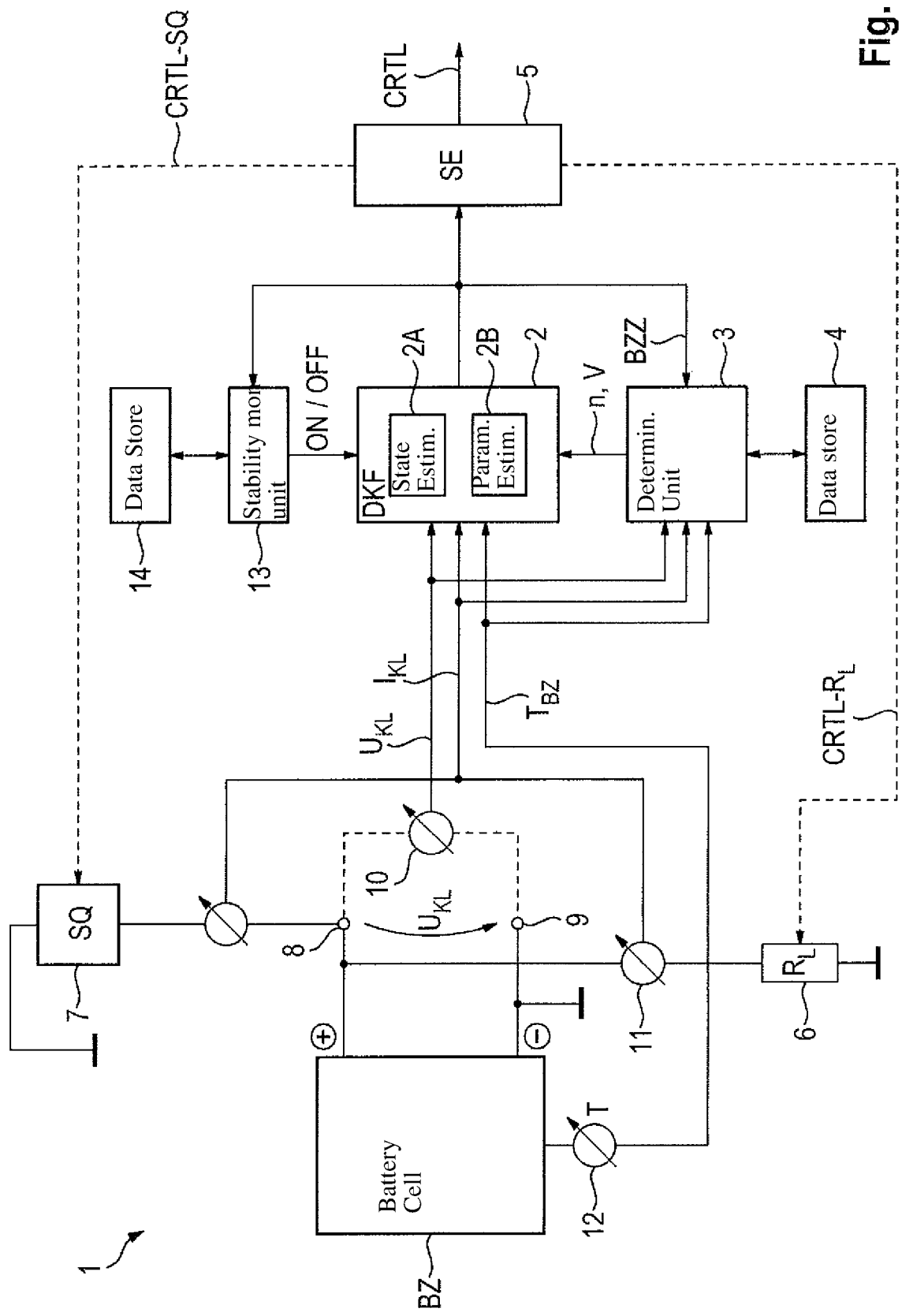
FIG. 3 shows a block diagram to illustrate an exemplified embodiment of a device in accordance with the invention for detecting battery cell states and/or battery cell parameters of a battery cell with a stability monitoring device according to a further aspect of the invention.

FIG. 3 shows a block diagram to illustrate an exemplified embodiment of a device 1 for detecting battery cell states BZZ and/or battery cell parameters BZP of at least one battery cell BZ. As can be seen in FIG. 3, the detection device 1 in accordance with the invention has a dual Kalman filter 2 in the illustrated exemplified embodiment. The dual Kalman filter 2 consists of two coupled Kalman filters. The first Kalman filter 2A of the dual Kalman filter 2 is used as a state estimator ZS for estimating battery cell states BZZ. The second Kalman filter 2B of the dual Kalman filter 2 is used as a parameter estimator PS for estimating battery cell parameters BZP of the battery cell BZ. Furthermore, the detection device 1 has a determination unit 3 which is suitable for determining noise components n, v of the state estimator 2A and of the parameter estimator 2B on the basis of a stored characteristic parameter behaviour of the battery cell BZ. The characteristic parameter behaviour of the battery cell BZ can be stored e.g. in a data store 4. The battery cell states BZZ and the battery cell parameters BZP can be adapted automatically to a specified battery model BM of the battery cell BZ by means of the dual Kalman filter 2 on the basis of the noise components n, v determined by the determination unit 3. The state estimator ZS of the dual Kalman filter 2 is formed by a first Kalman filter 2A and the parameter estimator PS of the dual Kalman filter 2 is formed by a second Kalman filter 2B. In the case of one possible embodiment of the detection device 1, the two Kalman filters 2A, 2B of the dual Kalman filter 2 are each formed by a linear Kalman filter LKF, an extended Kalman filter EKF, an unscented Kalman filter UKF, a square-root unscented Kalman filter SF-UKF or by a central-difference Kalman filter CD-KF. The Kalman filter 2 provides estimated values for system state variables x, $$\dot{x} = A \cdot x + B \cdot u + v$$

$$y = C \cdot x + n$$

where x is the state vector,
A represents the system matrix,
B represents the input matrix,
u is the deterministic input or also control vector,
v represents a Gaussian-distributed process noise,
y forms an output value which is produced from the output matrix
C and the Gaussian-distributed measurement noise n.

In the case of one possible embodiment, the terminal current $I_{KL}$ and/or the terminal voltage $U_{KL}$ of the battery cell BZ are used as the deterministic input variable or control vector u.

Figure 4:
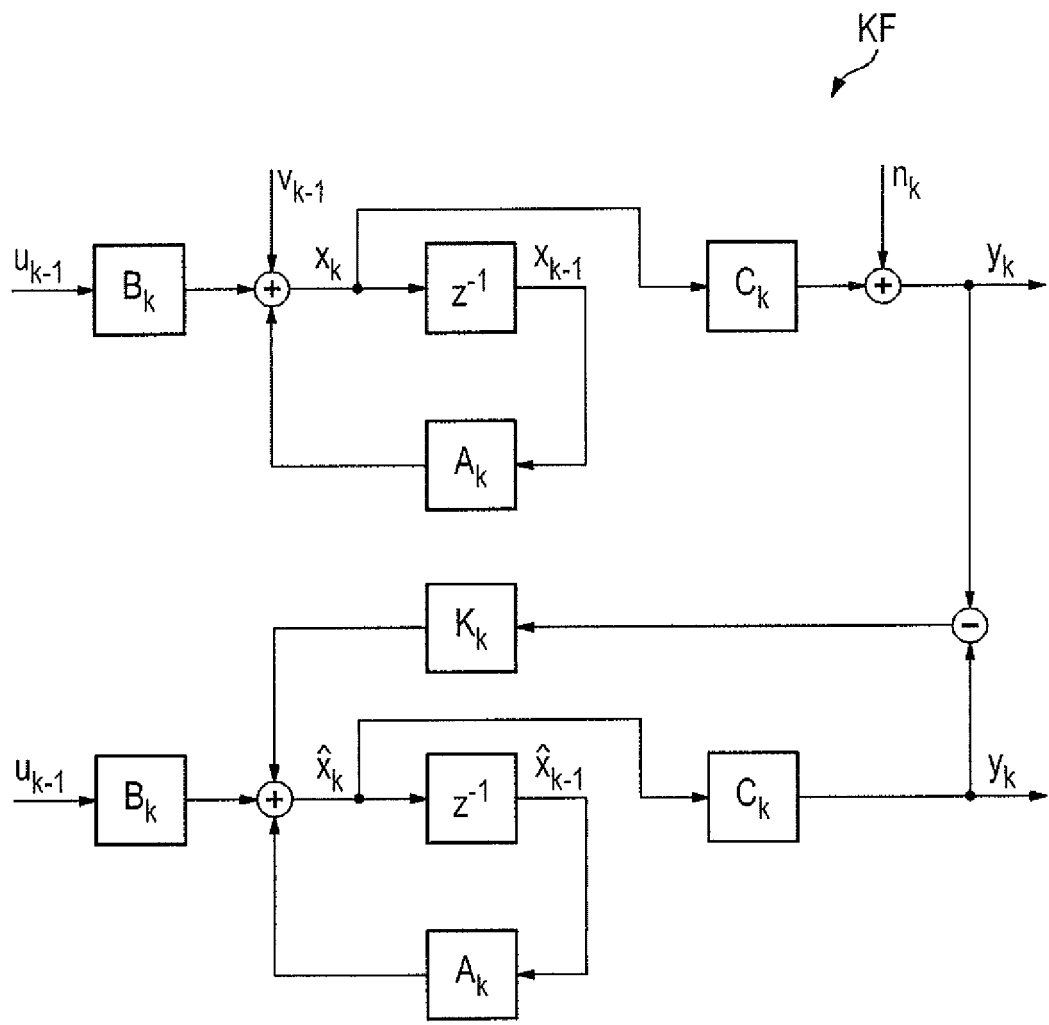
FIG. 4 shows a block diagram to illustrate an exemplified embodiment of a Kalman filter which can be monitored by the method in accordance with the invention and by the device in accordance with the invention.

FIG. 4 shows the structure of a linear discrete Kalman filter 2. The linear discrete Kalman filter KF illustrated in FIG. 4 can be used as a state estimator 2A and/or as a parameter estimator 2B of the dual Kalman filter 2. The upper part of the Kalman filter 2 illustrated in FIG. 4 depicts the battery model BM of the battery cell BZ, whereas the lower part of the Kalman filter KF as an adaptive filter minimises errors in the states, in particular in the battery cell states BZZ, by means of Kalman amplification. x represents the state vector of the battery cell BZ and y represents the output vector of the battery cell BZ. Located at the input of the Kalman filter KF is a deterministic control vector u, such as e.g. the measured terminal voltage $U_{KL}$ and/or the measured terminal current $I_{KL}$ of the battery cell BZ.

For non-linear systems, discretization is not possible via the Laplace transform. The output form is a state space representation which consists of non-linear first-order differential equations:

$$\dot{x}=f(x,u)+v$$

$$y=h(x,u)+n$$

where v is the process noise, n represents the measurement noise, x is the state vector of the battery cell, x is the output vector of the battery cell, u is the deterministic input vector, and f, h represent non-linear functions.

In the case of one possible embodiment, the Kalman filter KF used as a state estimator ZS or parameter estimator PS is formed by a linear Kalman filter. In the case of a further possible embodiment, extended Kalman filters EKF can also be used. In this case, the discrete system matrix A is approximated from a Taylor series. The continuous system matrix A and the output matrix C are approximated with the aid of a first-order approximation (Jacobi matrix) from the non-linear differential equations.

In the case of a further possible alternative embodiment, the two Kalman filters KF of the dual Kalman filter 2 are formed by unscented Kalman filters UKF. The unscented Kalman filter UKF belongs to the group of sigma-point Kalman filters. In the case of this type of filter, the problem of the EKF in terms of a linearisation and the precision limited thereby is solved by deduction-free approaches. In this case, the system equations are not approximated via Taylor series, but instead are calculated by function evaluations at various points, the so-called sigma points. The sigma points are selected as inputs of the non-linear function such that they precisely detect the average value and the covariance of the sought-after state.

In the case of a further possible embodiment of the detection device 1 in accordance with the invention, the two Kalman filters 2A, 2B of the dual Kalman filter 2 are formed by square-root unscented Kalman filters SR-UKF. A disadvantage when using UKF filters is that of calculating a necessary square root of the sigma points $S_k$ in order to determine the state covariance $P_k = S_k S_{Tk}$. For example, a Cholesky factorisation which, however, requires significant computational effort can be used for the sigma points. The sigma points $S_k$ are carried directly with a square-root unscented Kalman filter SR-UKF, without a re-factorisation being required at every time segment. Therefore, the Kalman filter becomes more stable because the state covariance assumes positive-semi-defined values and thus has a similarly recursive behaviour as the linear Kalman filter. For this purpose, in the case of one possible embodiment the square-root unscented Kalman filter SR-UKF can employ various linearly algebraic techniques, e.g. QR decomposition, the updating of the Cholesky factor or the method of least squares.

In the case of a further possible embodiment of the detection device 1 in accordance with the invention, the two Kalman filters 2A, 2B of the dual Kalman filter 2 can be formed in each case by a central-difference Kalman filter CD-KF. A central-difference Kalman filter CD-KF is based upon an interpolation formula by Stirling and is similar in terms of its circuit-wise structure to the unscented Kalman filter UKF.

Figure 5:
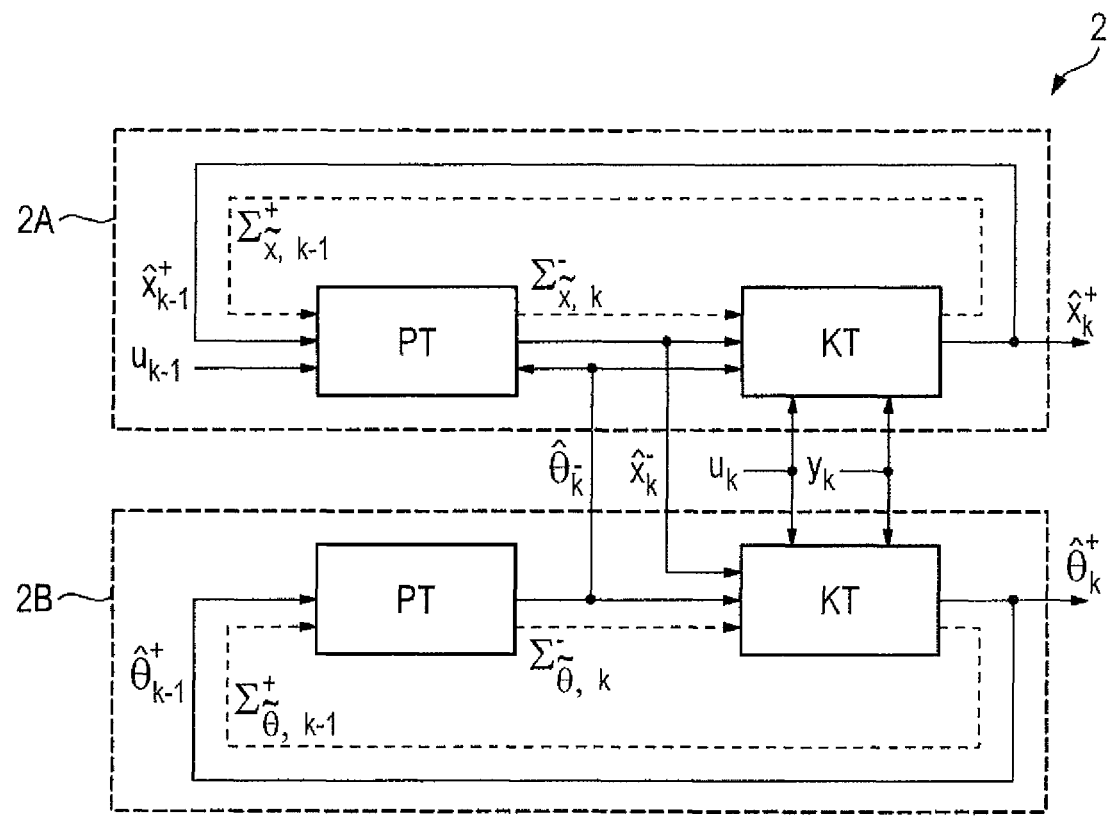
FIG. 5 shows a further block diagram to illustrate the structure of a dual Kalman filter, the stability of which can be monitored by the method in accordance with the invention and by the device in accordance with the invention.

FIG. 5 shows a structure of a dual Kalman filter 2 which can be used in the detection device 1 in accordance with the invention. The dual Kalman filter KF includes a state estimator 2A and a parameter estimator 2B. Both the state estimator 2A and the parameter estimator 2B can be formed by a Kalman filter 2, wherein each Kalman filter 2 includes a prediction part PT and a correction part KT. The state estimator 2A is used for estimating battery cell states BZZ of the battery cell BZ. The parameter estimator 2B of the dual Kalman filter 2 is used for estimating battery cell parameters BZP of the battery cell BZ. The battery cell states BZZ and the battery cell parameters BZP are adapted automatically to a specified battery model BM of the battery cell BZ by means of the dual Kalman filter 2 on the basis of the determined noise components n, v. These noise components n, v are determined by the determination unit 3 illustrated in FIG. 3.

In one possible embodiment, the battery cell states BZZ adapted by the state estimator 2A of the dual Kalman filter 2 and the battery cell parameters BZP adapted by the parameter estimator 2B of the dual Kalman filter 2 are output to a control unit 5, as illustrated in FIG. 3. In one possible embodiment, this control unit 5 is used for controlling a load, e.g. an electric motor, connected to the battery cell BZ. Furthermore, in an alternative embodiment the control unit 5 can be provided for controlling a current source connected to the battery source BZ. As illustrated in FIG. 3, in the case of one possible embodiment the control unit 5 provides control signals CRTL-RL for an electric load 6 connected to the battery cell BZ. This load 6 can be e.g. an electric motor of an electric vehicle. Furthermore, in the exemplified embodiment illustrated in FIG. 3, the control unit 5 provides a control signal CTRL-SQ for a current source 7 connected to the battery cell BZ. The current source 7 is connected to a first battery cell terminal 8 of the battery cell BZ. The load 6 is connected to a second battery cell terminal 9 of the battery cell BZ.

In the exemplified embodiment illustrated in FIG. 3, various sensors are provided on the battery cell BZ. In one possible embodiment, the sensors comprise a voltage sensor 10, a current sensor 11 and a temperature sensor 12. The voltage sensor 10 measures a terminal voltage $U_{KL}$ between the two battery cell terminals 8, 9. In the illustrated exemplified embodiment, the current sensor 11 serves to measure a terminal current $I_{KL}$ of the battery cell BZ. Furthermore, the temperature sensor 12 is used for measuring a temperature T of the battery cell BZ. The terminal voltage $U_{KL}$, the terminal current $I_{KL}$ and the temperature T of the battery cell BZ are measurement variables MG detected by means of sensors. These measurement variables MG are supplied to the dual Kalman filter 2 as deterministic input measurement variables, as shown by the block diagram according to FIG.

3. The measurement variables MG, i.e. the terminal voltage $U_{KL}$, the terminal current $I_{KL}$ and/or the temperature T of the battery cell BZ, are also supplied to the determination unit 3. The determination unit 3 determines the noise components n, v of the state estimator 2A and of the parameter estimator 2B on the basis of a stored characteristic parameter behaviour of the battery cell BZ. In one possible embodiment, the data store 4 stores, for each battery cell parameter BZP, its average value $\mu_{BZP}$, its variance $\sigma_{BZP}$ in relation to each battery cell state BZZ, and the measurement variables MG, detected by means of sensors, of the battery cell BZ. The process noise $v_{BZP}$ of the battery cell parameters BZP is determined by the determination unit 3 in dependence upon its read-out characteristic parameter behaviour in relation to a battery cell state BZZ based on the measurement variables MG detected by means of sensors. Furthermore, a process noise $v_{BZZ}$ of the battery cell state BZZ is determined in dependence upon its read-out parameter behaviour by the determination unit 3 in relation to at least one battery cell parameter BZP. For each measurement variable MG detected by means of sensors, the determination unit 3 calculates its measurement variable noise n based on an average value $\mu_{MG}$ and/or a variance $\sigma_{MG}$ of a noise behaviour of the corresponding measurement variable sensor 10, 11, 12 in relation to the measurement variable MG read out from the data store 4. The calculated measurement variable noise of the various measurement variables MG can be summed in order to determine the measurement noise n by the determination unit 3. The determined measurement noise n is supplied to the dual Kalman filter 2 as shown in FIG. 3.

The dual Kalman filter 2 comprises two Kalman filters 2A, 2B which can be adjusted in parallel to each other. The two Kalman filters 2A, 2B of the dual Kalman filter 2 can have the same input vector $u_{k-1}$ and the same measurement variables $y_k$. In the respective prediction part PT of the two Kalman filters 2A, 2B, the previously calculated states and parameters form the input variables of the present time step. The two Kalman filters 2A, 2B within the dual Kalman filter 2 can have the same filter type or be formed by different filter types. The state vector x of the dual Kalman filter 2 comprises the state vector of the state estimator 2A and the state vector of the parameter estimator 2B. The state vector $x_{BZZ}$ of the state estimator 2A includes the battery cell states BZZ of the battery cell BZ. The state vector of the parameter estimator 2B of the dual Kalman filter 2 includes the battery cell parameters $x_{BZP}$ of the battery cell BZ. Since the supplied measurement variables MG of the state estimator 2A and of the parameter estimator 2B are the same, only the additional dependency of the parameter vector in the non-linear output equation changes in the continuous state space representation of the parameter estimator 2B:

$$y=g(x,u,w)+n$$

In this embodiment, the adaptation of the battery cell parameter BZP is effected primarily via the parameter process noise.

In one possible embodiment of the method in accordance with the invention, a stability of the dual Kalman filter 2 is monitored. In so doing, an adaptation of the respective battery cell states BZZ by means the state estimator 2A of the dual Kalman filter 2, and an adaptation of the respective battery cell parameters BZP by means of the parameter estimator 2B of the dual Kalman filter 2 is suspended as soon as a threat of instability of the dual Kalman filter 2 is recognised. In the case of a further possible embodiment, the stability of the dual Kalman filter 2 is monitored on the basis of a covariance behaviour $P_{BZZ}$ of the battery cell states BZZ and on the basis of a covariance behaviour $P_{BZP}$ of the battery cell parameters BZP. In one possible embodiment, the covariance behaviour $P_{BZZ}$ of the battery cell state BZZ and/or the covariance behaviour $P_{BZP}$ of a battery cell parameter BZP of the dual Kalman filter 2 is compared with an associated stored desired covariance. An adaptation of a battery cell state BZZ by means of the state estimator 2A of the dual Kalman filter 2 is suspended as soon as its covariance behaviour $P_{BZZ}$ exceeds the stored associated desired covariance behaviour of the respective battery cell state BZZ. Furthermore, the adaptation of a battery cell parameter BZP by means of the parameter estimator 2B of the dual Kalman filter 2 is suspended as soon as its covariance behaviour $P_{BZP}$ exceeds the stored associated desired covariance behaviour of the respective battery cell parameter BZP. In the case of one possible embodiment, the stored desired covariance behaviour includes a funnel function which decreases exponentially over time and of which the coefficients are configured.

Figure 13:
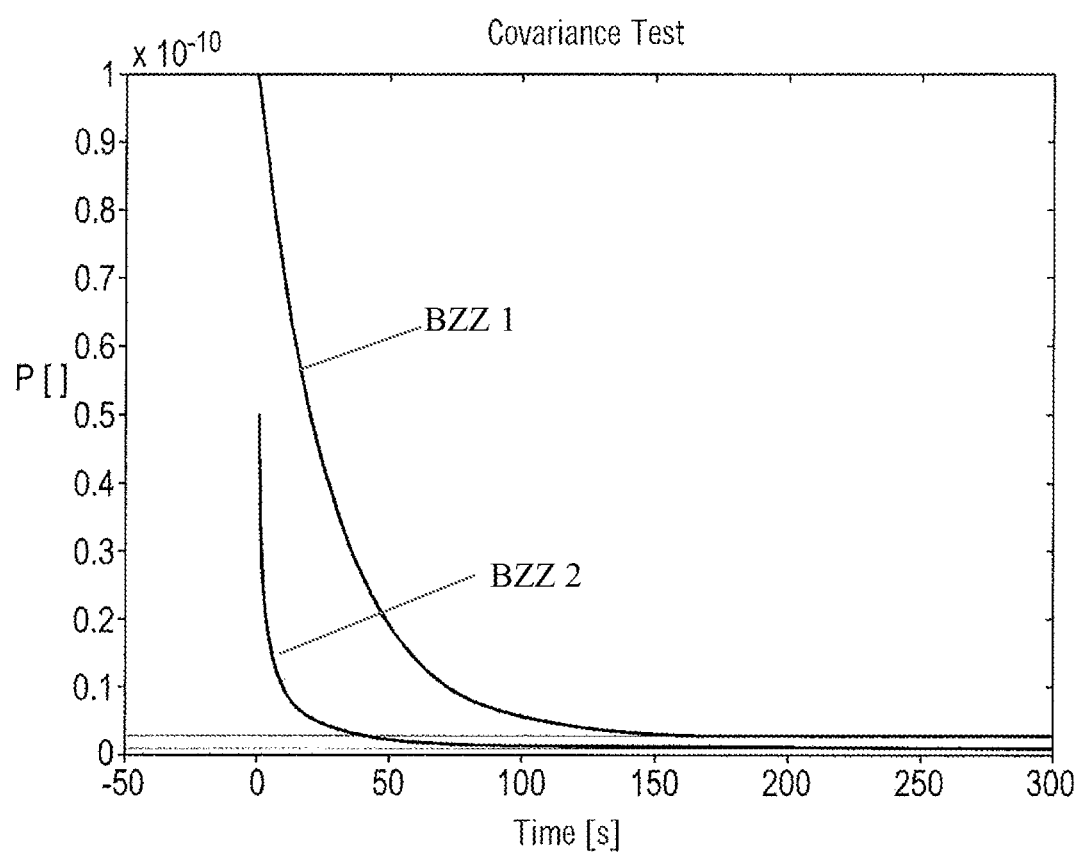
FIG. 13 shows an image to illustrate a theoretical progression of a covariance.
Figure 14:
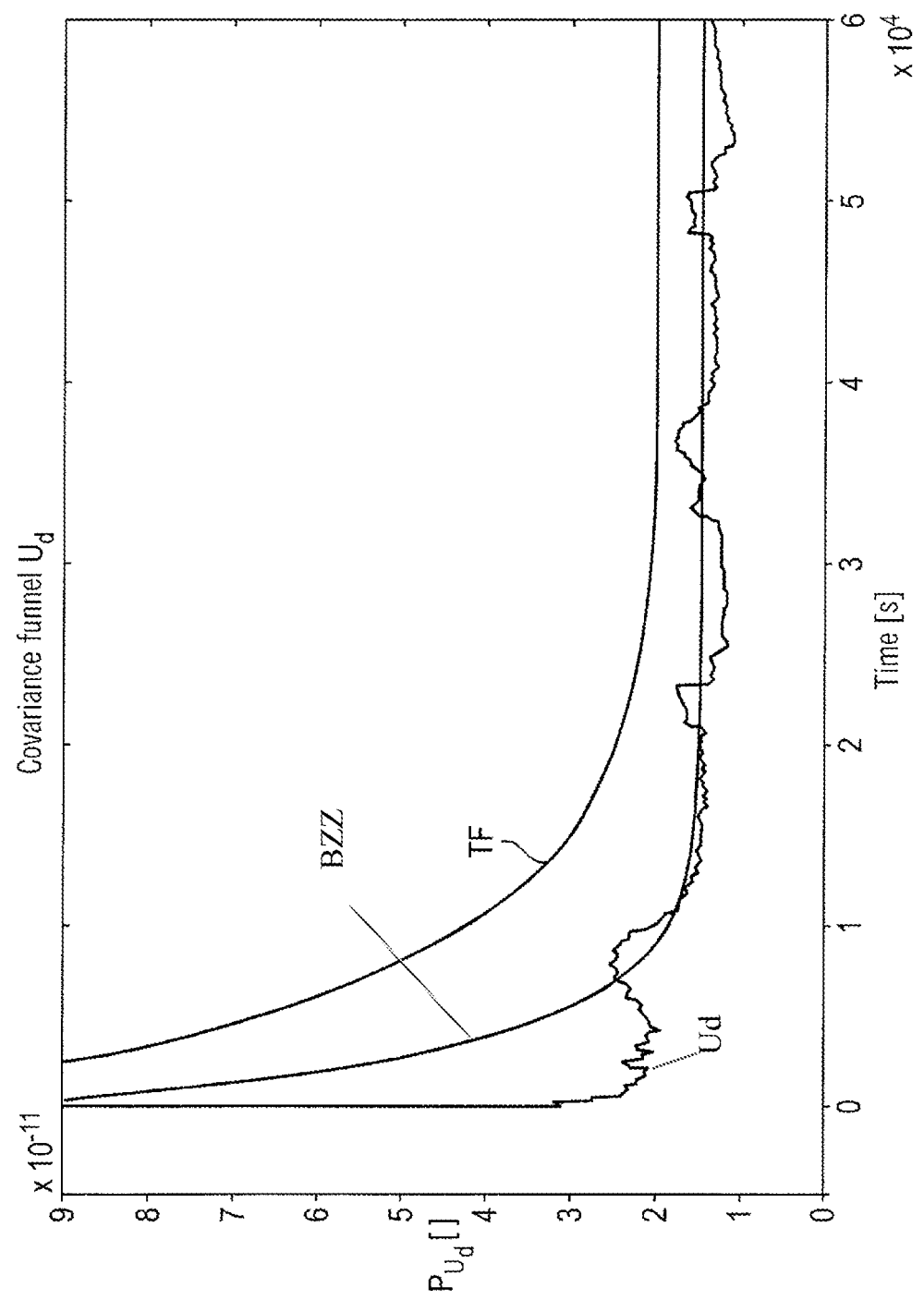
FIG. 14 shows by way of example the progression of a diffusion voltage within a funnel function, as can be used in the case of the method in accordance with the invention and the device in accordance with the invention for stability monitoring.

In the case of the exemplified embodiment illustrated in FIG. 3, the detection device 1 has a stability monitoring unit 13 in accordance with the invention, which is suitable for suspending the adaptation of a battery cell state BZZ by the state estimator 2A of the dual Kalman filter 2 and/or the adaptation of a battery cell parameter BZP by the parameter estimator 2B of the dual Kalman filter 2 as soon as the corresponding covariance behaviour exceeds a stored associated desired covariance behaviour. In the case of one possible embodiment, the desired covariance behaviour is stored in a data store 14 of the detection device 1. In the case of one possible implementation, the stored desired covariance behaviour includes a funnel function which decreases exponentially over time, as illustrated in FIGS. 13, 14.

Figure 6:
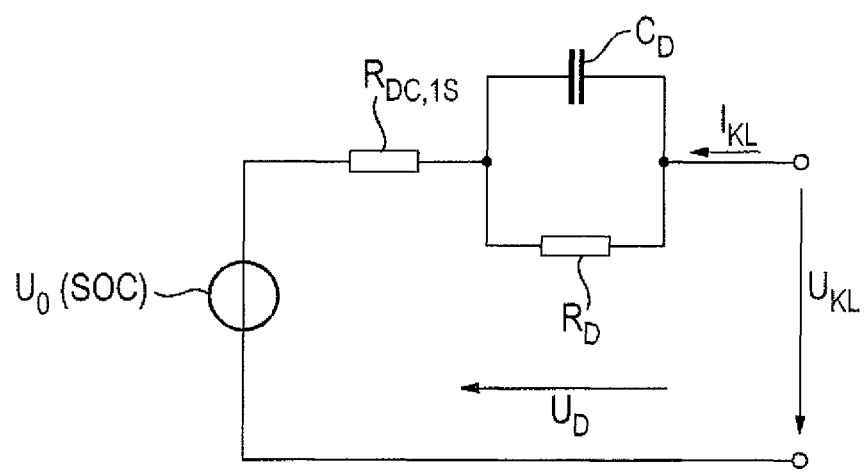
FIG. 6 shows an example of a battery model of a battery cell which can be used in the case of the method in accordance with the invention.

FIG. 6 shows by way of example a battery model BM which can be used in the case of the method in accordance with the invention and the detection device 1.

The resistance $R_{DC1s}$ is a combined resistance which combines the real cell internal resistance $R_i$ of the battery cell BZ and all dynamic procedures occurring within 1 sec, e.g. charge transfer procedures. The resistance $R_D$ represents the diffusion resistance of the battery cell BZ. The capacitance $C_D$ represents the diffusion capacitance of the battery cell BZ. Furthermore, FIG. 6 illustrates the terminal voltage $U_{KL}$ of the battery cell BZ and the terminal current $I_{KL}$ of the battery cell BZ. Furthermore, the battery model BM demonstrates a diffusion voltage $U_D$. which is applied across the diffusion resistance $R_D$ and the diffusion capacitance $C_D$. $U_O(SOC)$ is the state of charge-dependent open-circuit voltage (OCV) of the battery cell.

The state of charge SoC is defined as the integrated terminal current over the loading time period or the deduction of the state of charge SoC is the terminal current $I_{KL}(t)$ in relation to the capacitance of the battery cell.

$$S\dot{O}C = \frac{1}{C_n} I_{KL}(t) \qquad (1)$$

The diffusion voltage UD can be calculated from a first order differential equation:

$$\dot{U}_D = -\frac{1}{R_D \cdot C_D} \cdot U_D(t) + \frac{1}{C_D} I_{KL}(t) \qquad (2)$$

The state space representation can now be made up therefrom as follows:

$$\begin{bmatrix} \dot{U}_D \\ \dot{SOC} \end{bmatrix} = \begin{bmatrix} -\dfrac{1}{R_D C_D} & 0 \\ 0 & 0 \end{bmatrix} \begin{bmatrix} U_D \\ SOC \end{bmatrix} + \begin{bmatrix} \dfrac{1}{C_0} \\ \dfrac{1}{C_n} \end{bmatrix} I_{KL}(t) \qquad (3)$$

The terminal voltage $U_{KL}$ is calculated from the internal voltage drops of the battery cell BZ, caused by the terminal current $I_{KL}$ to give the following:

$$U_{KL}(t) = U_O(SOC) + R_{DC \cdot 1s} I_{KL}(t) + U_D(t) \qquad (4)$$

In this simple exemplified embodiment, the state vector x(t) therefore contains:

$$[x_1 \, x_2]^T = [U_D(t) \, SOC(t)^T] \qquad (5)$$

An essential variable, which can influence the behaviour of the Kalman filter 2, is the noise, i.e. the process noise v and the measurement noise n. The measurement noise n takes into consideration the errors in the measurement value and the effects thereof on the model adaptation traced therefrom. The process noise v takes into consideration the simplification and error tolerance of the battery model BM. Hereinunder, the respective noise term for the dual Kalman filter 2 is derived in order to carry out rapid and efficient adaptation in a possible real application.

The consideration of the measurement noise n is carried out in the output equation:

$$y(t) = C_x(t) + n \qquad (6)$$

When examining the output equation of the battery model BM used, various measurement noise components can be identified, specifically the measurement noise of the cell voltage measurement, the measurement noise of the current sensor and a noise value in relation to the diffusion voltage. From the variance σ of the respective terms, the measurement noise n can be derived:

$$U_{KL} = U_O(SOC) + R_{DC \cdot 1s}(I_{KL}(t) + \sigma_{I_{KL}}) + (U_D(t) + \sigma_{U_D}) + \sigma_{U_{KL}}$$

$$n = R_{DC \cdot 1s} \sigma_{I_{KL}} + \sigma_{U_D} + \sigma_{U_{KL}} \qquad (7)$$

The weighting of the three noise components can sometimes differ strongly from one to another.

Figures 7A, 7B:
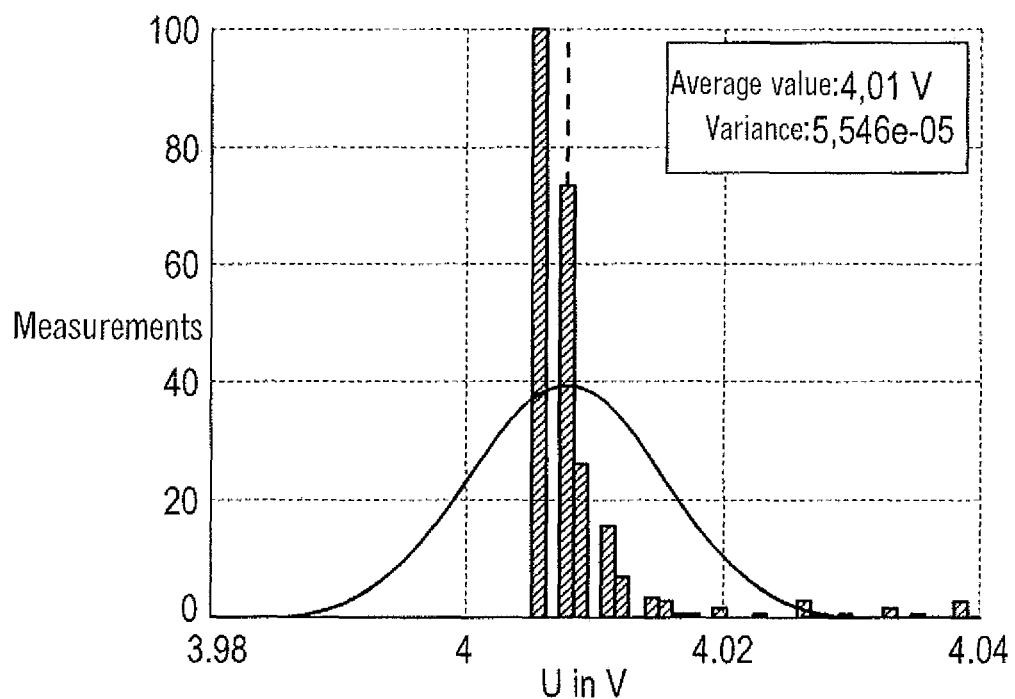
FIGS. 7A, 7B show by way of example one possible noise behaviour of voltage and current sensors in the case of a battery management system in accordance with the invention.

FIGS. 7A, 7B show by way of example the noise behaviour of voltage and current sensors of the battery management system in accordance with the invention. FIG. 7A shows the noise behaviour of a voltage sensor of the battery management system, e.g. of the voltage sensor 10 shown in FIG. 3. FIG. 7A shows the distribution of measurements with respect to the terminal voltage $U_{KL}$. For example, the average value μ is 4.01 V and the variance is 6.546e-0.5.

FIG. 7B shows by way of example the behaviour of a current sensor within the battery management system, e.g. of the current sensor 11 shown in FIG. 3. It is possible to see the number of measurements distributed over different terminal currents $I_{KL}$. The average value μ is e.g. μ=−1.14 A and the variance σ is 1.389e-01.

Figure 8A:
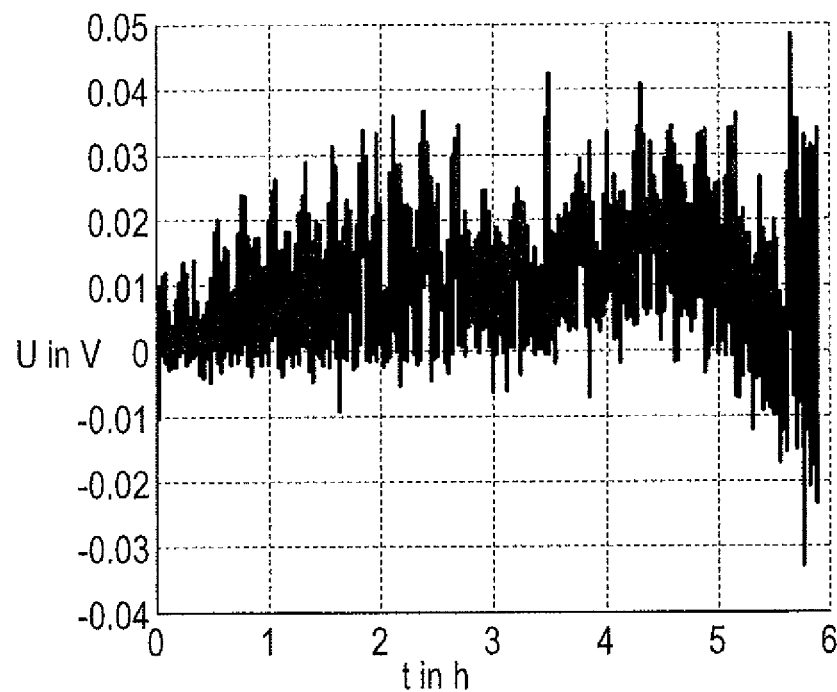
FIGS. 8A, 8B show by way of example a noise behaviour of a battery model used in the case of the method in accordance with the invention.
Figure 8B:
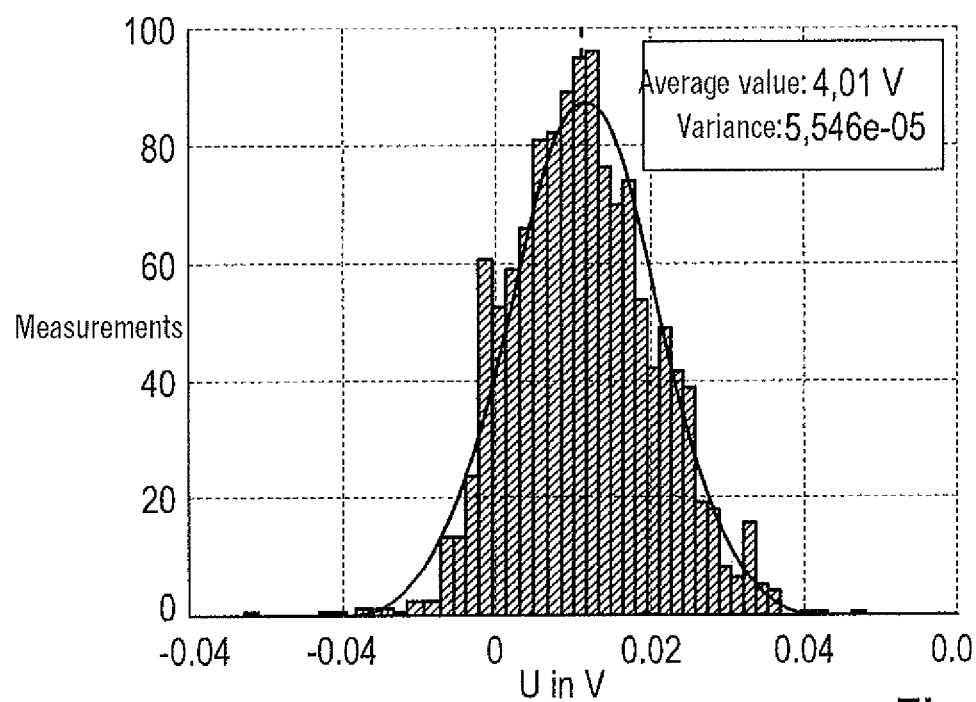

FIGS. 8A, 8B show a noise behaviour of the battery model BM. FIG. 8A shows an error between measurement and simulation over time t. FIG. 8A shows an absolute error in the battery modellings in relation to a true cell voltage of the battery cell BZ.

FIG. 8B shows a histogram of the deviation. FIG. 8B thus shows an associated noise behaviour. FIG. 8B shows e.g. the number of measurements for various voltages U.

Since the internal resistance $R_{DC1s}$ illustrated in the battery model BM shown in FIG. 6 behaves in terms of noise in exactly the same way as a parameter, it can be compared together with the parameter noise. When examining the process noise v1 of the first state $U_D$, it can be derived as follows:

$$\dot{U}_D = -\frac{1}{R_D C_D}(U_D(t) + \sigma_{U_D}) + \frac{1}{C_D}(I_{KL}(t) + \sigma_{I_{KL}}) \qquad (8)$$

$$v_1 = -\frac{1}{R_D C_D} \sigma_{U_D} + \frac{1}{C_D} \sigma_{I_{KL}}$$

For examining the second process noise component v2 of the second battery cell state SOC, the derivation produces the following:

$$\dot{SOC} = \frac{1}{C_n}(I_{KL}(t) + \sigma_{I_{KL}}) \qquad (9)$$

$$v_2 = \frac{1}{C_n} \sigma_{I_{KL}}$$

When modelling the process noise v, the third state $R_{dc1s}$ can also be observed because its behaviour is the same as the parameters. The process noise of the battery cell parameters BZP establishes how greatly the individual battery cell parameters BZP must change. In the case of conventional arrangements, the parameter estimator 2B is used only in order to estimate fixed parameters or battery cell parameters BZP which no longer change. A changing battery cell parameter BZP can result in instability of the dual Kalman filter 2.

The process noise component $v_{BZP}$ occurs in the state space representation of the battery cell parameters BZP. Within the scope of basic considerations with regard to the Kalman filter 2, this noise value means nothing other than a specific probability of change in the corresponding battery cell parameter BZP. If a battery cell parameter BZP can change very greatly over wide ranges, this corresponds to a high variance σ of the relevant battery cell parameter BZP, whereas, conversely, a smaller change corresponds to a very small variance.

FIGS. 9A to 9D and 10A to 10D illustrate a dynamic dependency of the individual battery cell temperature BZP upon the temperature T, the state of charge SOC and the loading. If the variance σ of the corresponding battery cell parameter BZP in relation to the respective influence variable or battery cell characteristic variable BZK is deduced therefrom, a noise term of the battery cell parameter BZP can be determined. In this manner, it is possible e.g. in the case of the third battery cell parameter $R_{dc1s}$ and the two battery cell parameters $R_D$, $C_D$ to observe the state of charge dependency.

Figure 9A:
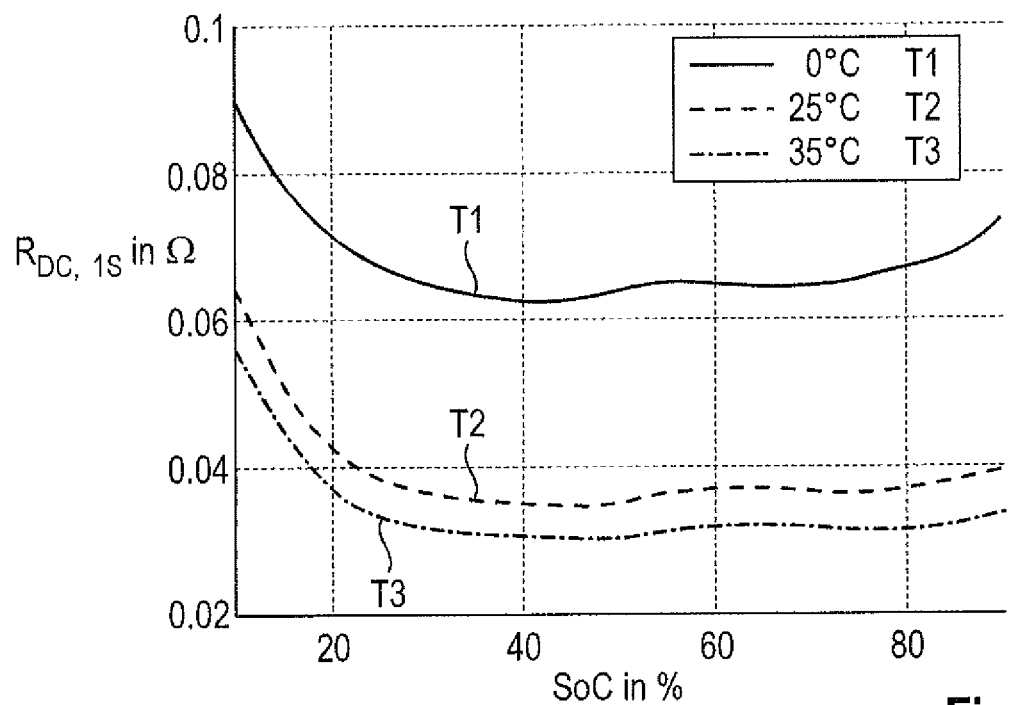
FIGS. 9A to 9D show diagrams to illustrate a temperature and state of charge dependency of parameters of the battery model.

FIG. 9A shows the dependency of the internal resistance $R_{dc1s}$ upon the state of charge SOC as the battery cell state BZZ for various temperatures T.

Figure 9B:
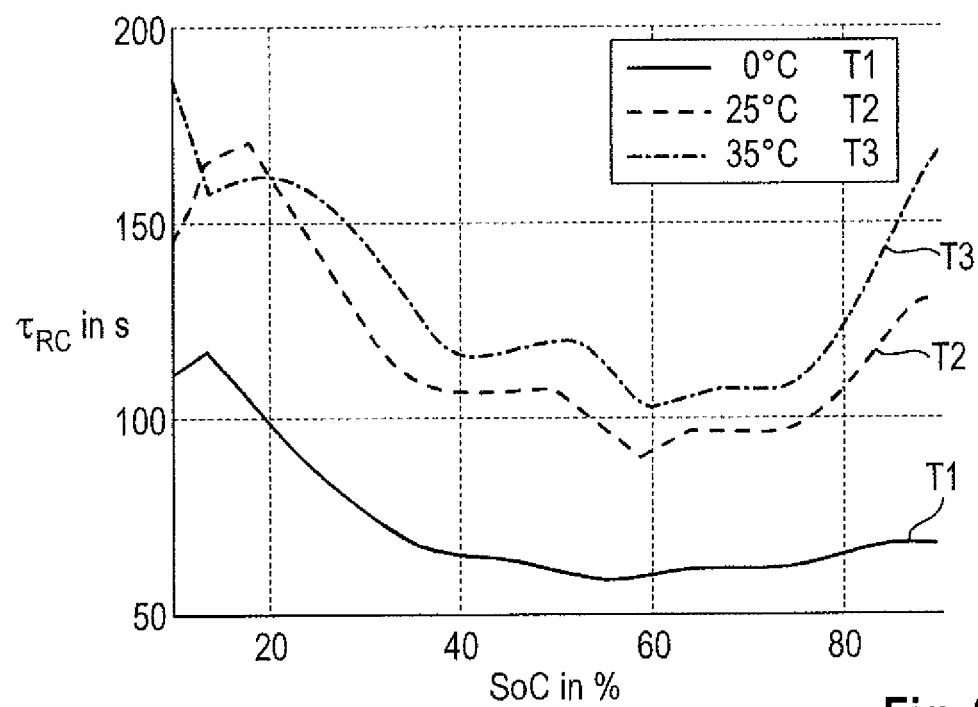

FIG. 9B shows the dependency of a time constant $\tau_{CD}$ ($\tau = R_D \times C_D$) upon the state of charge SOC for various temperatures.

Figure 9C:
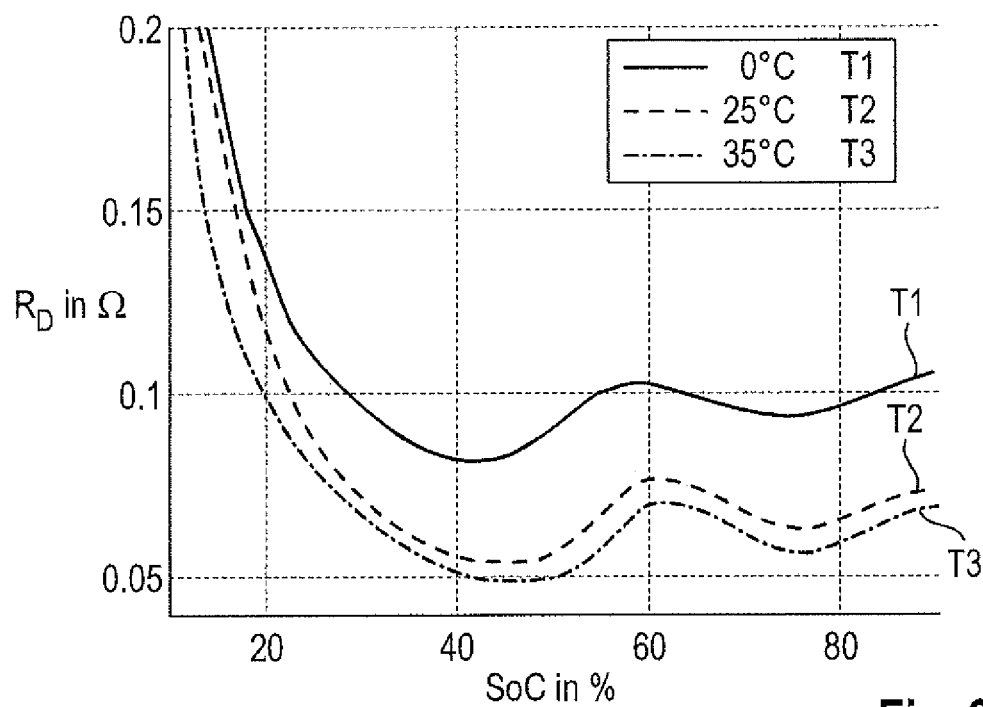

FIG. 9C shows the dependency of the diffusion resistance $R_D$ upon the state of charge SOC for various temperatures T.

Figure 9D:
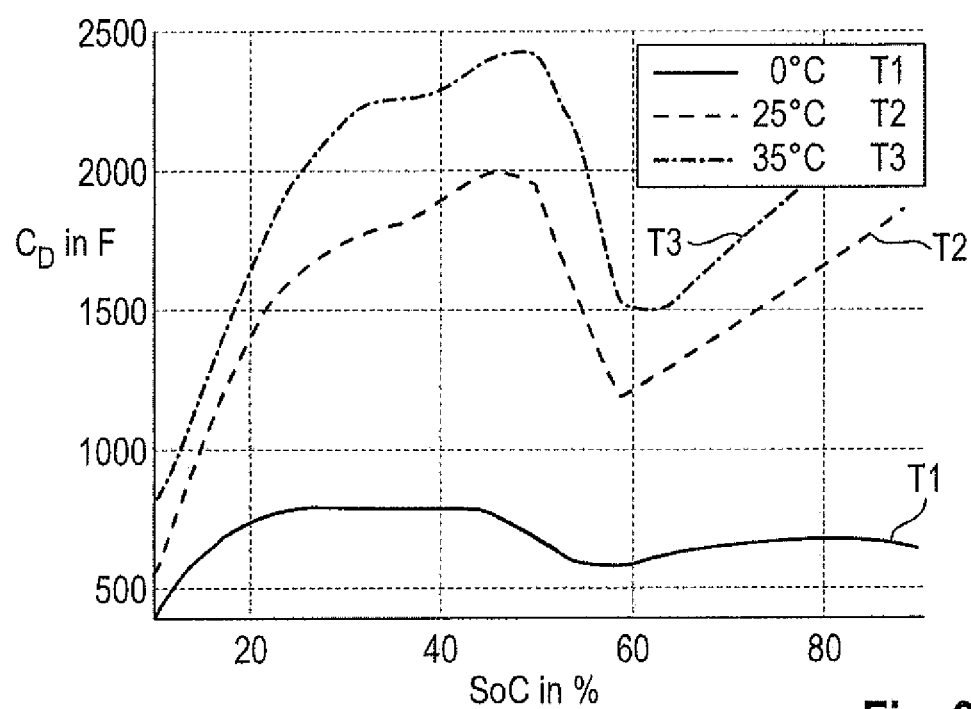

Furthermore, FIG. 9D shows the dependency of the diffusion capacitance $C_D$ upon the state of charge SOC for various temperatures T.

Figure 10A:
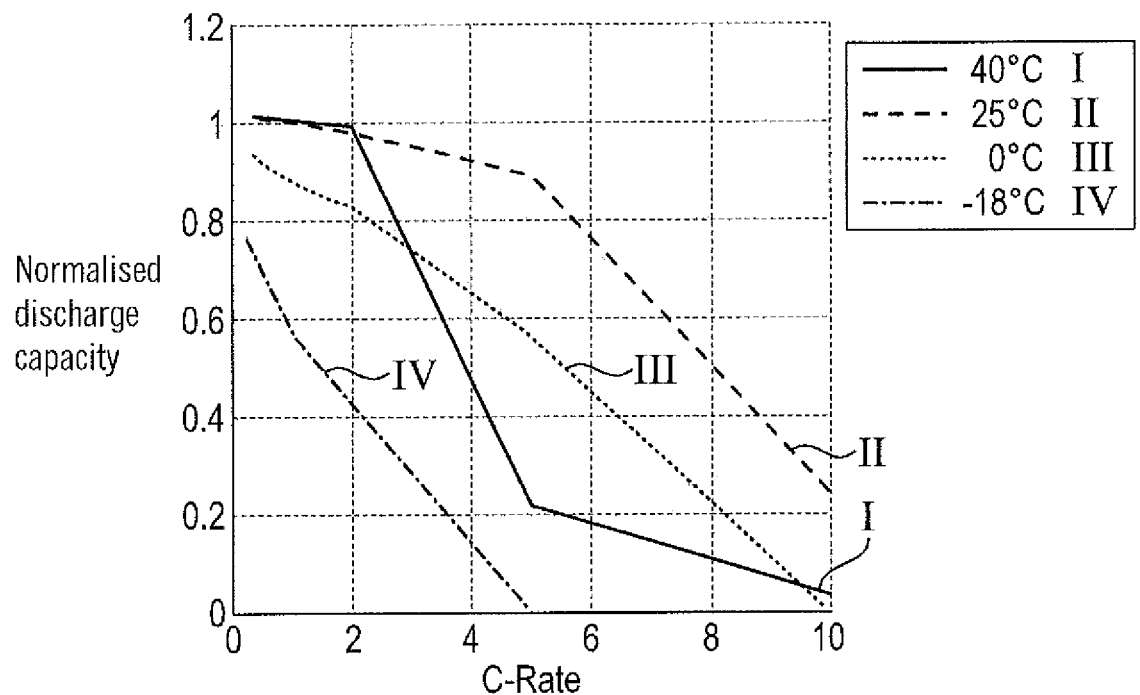
FIGS. 10A to 10D show diagrams to illustrate a normalised discharge capacity in the case of various conventional lithium-ion batteries.
Figure 10B:
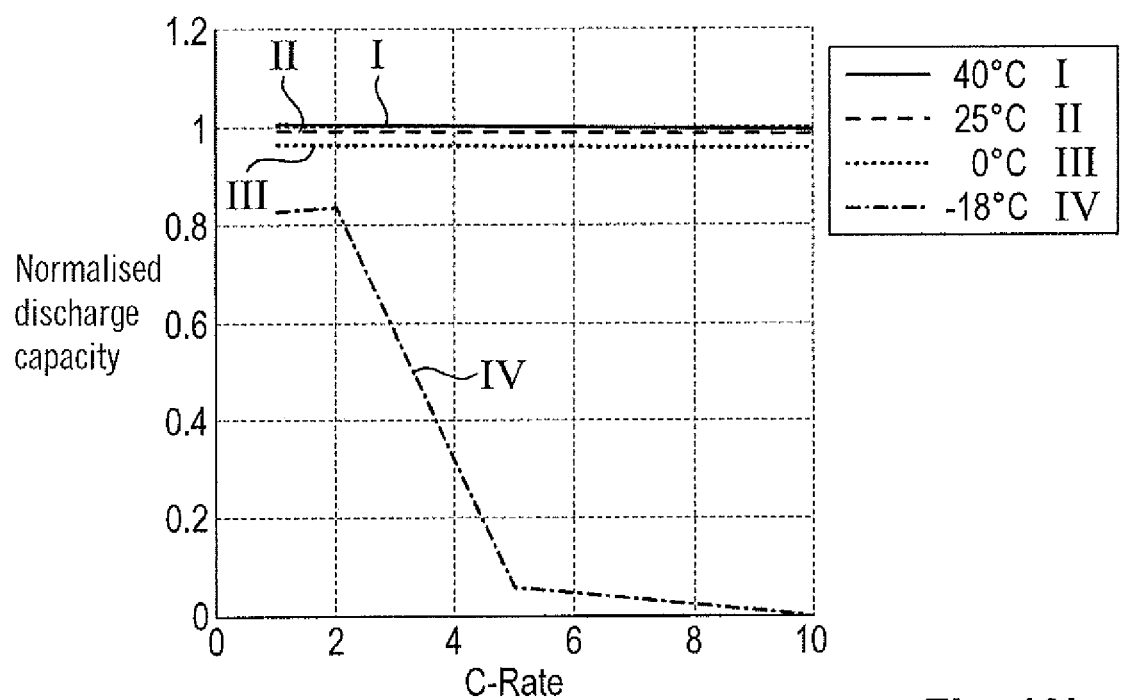
Figure 10C:
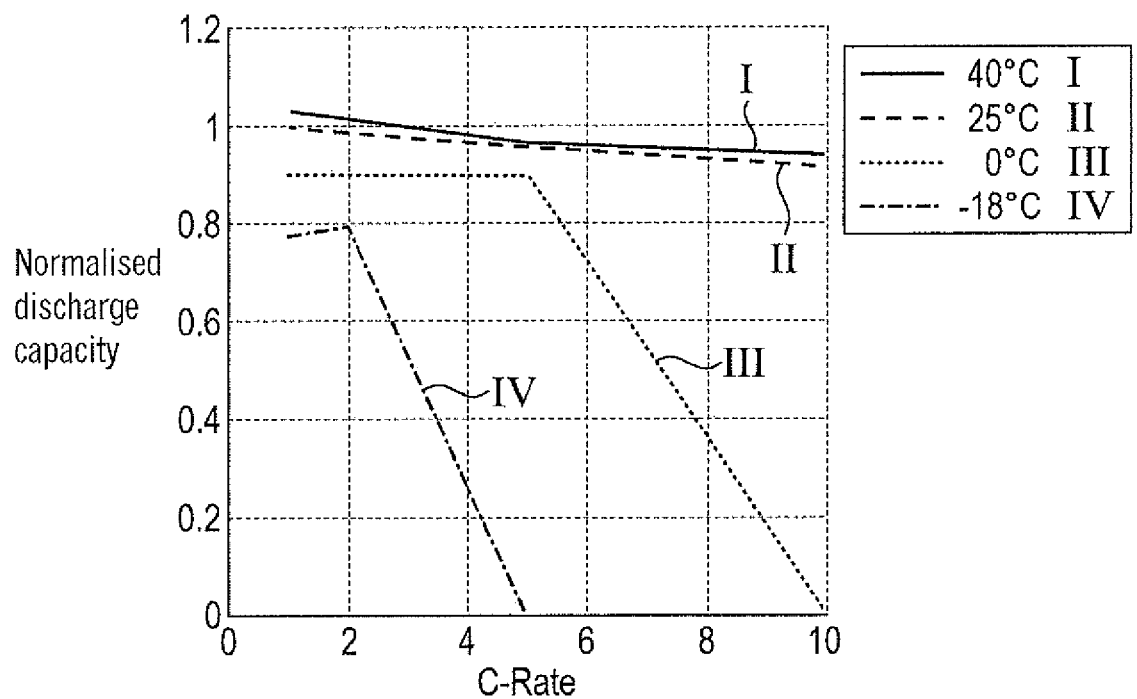
Figure 10D:
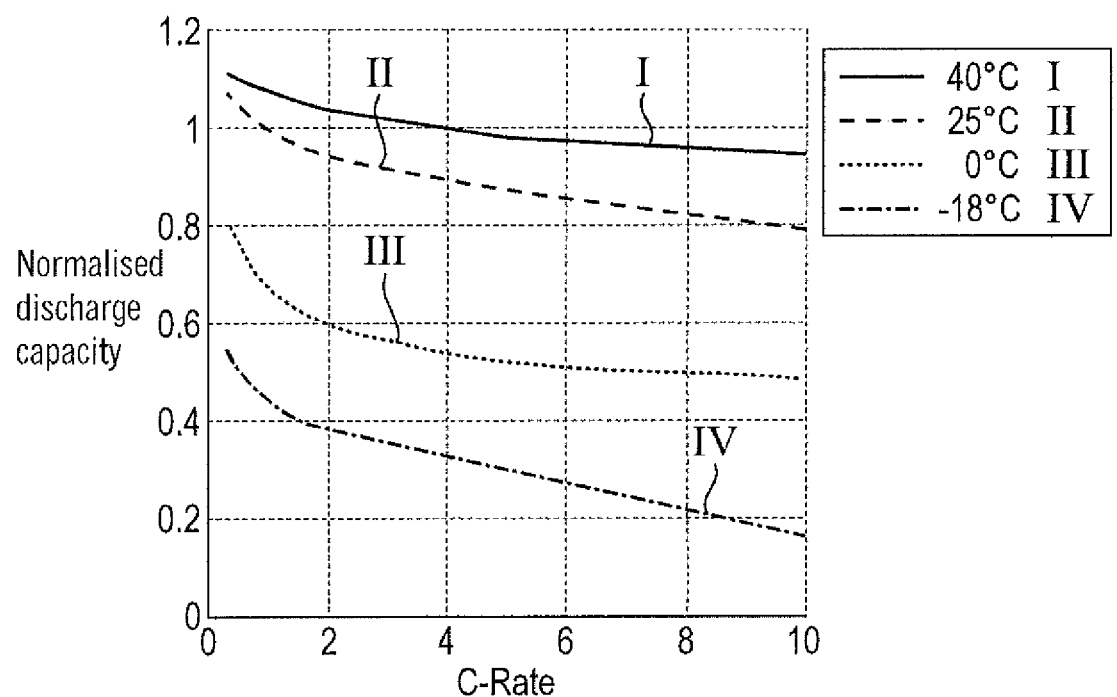

The capacitance $C_n$ likewise forms a battery cell parameter BZP. FIGS. 10A to 10D show the normalised discharge capacitance for various typical lithium-ion cell chemistries. FIG. 10A shows a normalised discharge capacity for an NMC battery.

FIG. 10A shows a normalised discharge capacity for an LFP battery for various temperatures T.

FIG. 10 shows the normalised discharge capacity in relation to the C-rate for various temperatures T. FIG. 10D shows the normalised discharge capacity over the C-rate for various temperatures T for an LTO battery. With the battery cell parameter $C_n$, its change in relation to the terminal current $I_{KL}$ or with regard to the C-rate is observed in FIGS. 10A to 10D. It can assumed that the temperature changes only relatively slowly in comparison with the other variables and therefore constitutes only a fraction of the noise covariance.

Figure 11A:
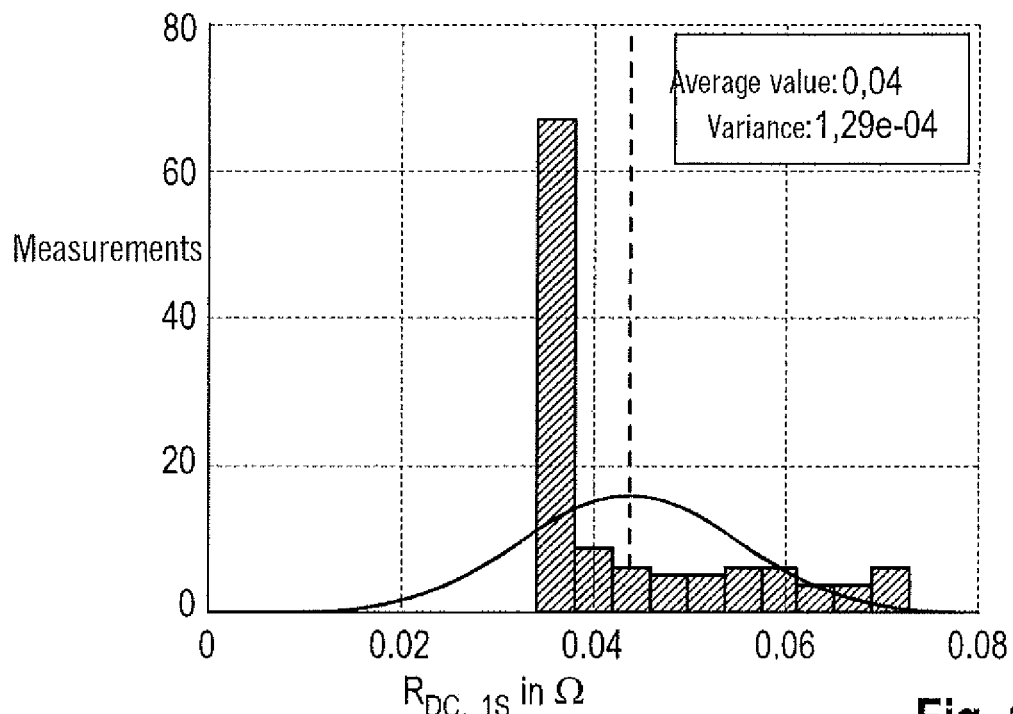
FIGS. 11A to 11D show diagrams to illustrate a variance of the change in the battery cell parameters and a state change in relation to the state of charge of a battery cell.
Figure 11B:
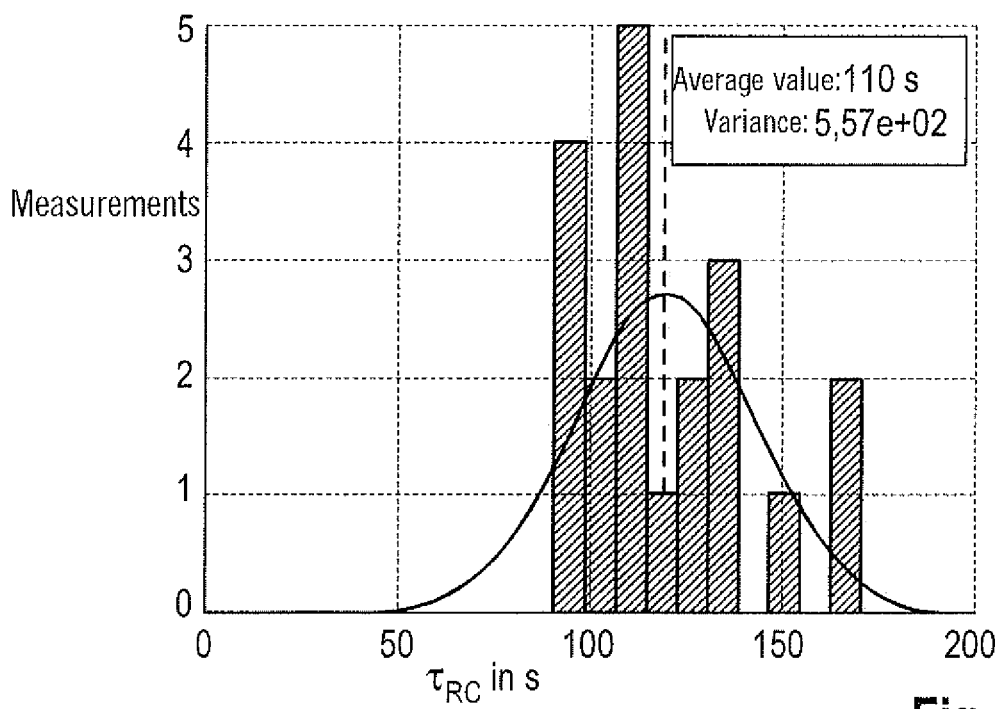
Figure 11C:
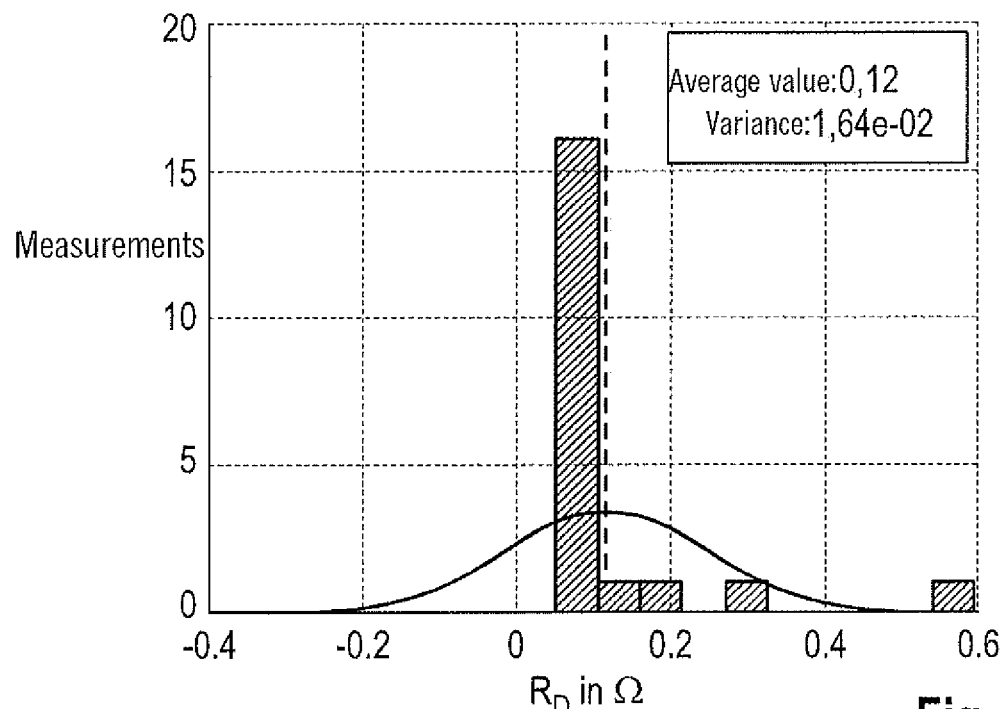
Figure 11D:
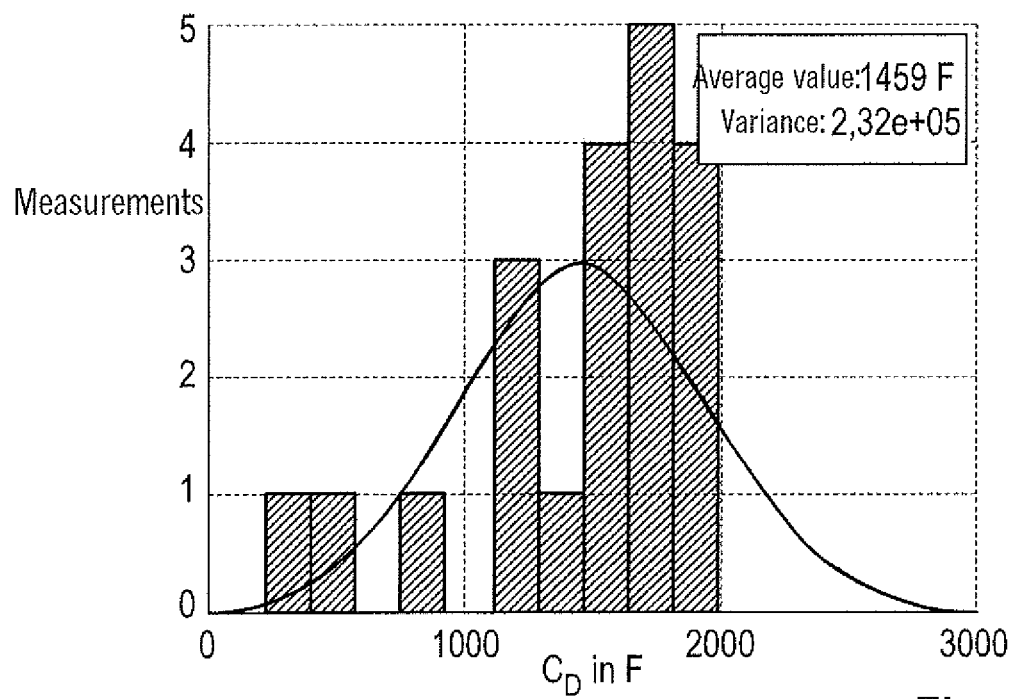

FIGS. 11A to 11D illustrate a variance of the change in the parameters and a state change with respect to the state of charge SOC. FIG. 11A shows the variance of the internal resistance $R_{dc,1s}$ in terms of the state of charge SOC. FIG. 11B shows the variance of a time constant in terms of the state of charge SOC. FIG. 11C shows the variance of the diffusion resistance $R_D$ with respect to the state of charge SOC. FIG. 11D shows the variance of a diffusion capacitance $C_D$ in terms of the state of charge SOC.

Since the variance, which is dependent on the state of charge SOC, is present, the difference in the state of charge SOC for the cycle period $t_2-t_2$, i.e. $(SOC(t_2)-SOC(t_1))$ can be used:

$$v_3 = (SOC(t_2)-SOC(t_1))\sigma_{R_{DC \cdot 1s}}$$

$$r_2 = (SOC(t_2)-SOC(t_1))\sigma_{R_D}$$

$$r_3 = (SOC(t_2)-SOC(t_1))\sigma_{C_D}$$

$$v_{3_k} = (x_{2_k}-x_{2_{k-1}})\sigma_{R_{DC \cdot 1s}}$$

$$r_{2_k} = (x_{2_k}-x_{2_{k-1}})\sigma_{R_D}$$

$$r_{3_k} = (x_{2_k}-x_{2_{k-1}})\sigma_{C_D} \quad (10)$$

As already shown in FIGS. 10A to 10D, the battery capacitance is dependent upon various factors, in particular upon the terminal current, the temperature, the discharge depth, ageing and recovery. On the basis of the various dependencies, it is possible to implement an adaptive method on the basis of modelling of the process noise component of the cell capacitance, the adaptation effort being minimised with said method.

In the case of this modelling, the dependency of the dynamically changing terminal current $I_{KL}$ can be taken into consideration, wherein it is assumed that the temperature T changes comparatively slowly and therefore makes a subordinate contribution to the variance σ. Since at lower temperatures T the capacitance of the battery cell BZ drops considerably, the cell behaviour at a temperature T=0° C. is used for the variance examination.

FIGS. 12A to 12D illustrate various histograms for various typical lithium-ion cell chemistries.

FIGS. 12A to 12D show a variance of the change in cell capacitance with respect to the terminal current $I_{KL}$ in four characteristic lithium-ion cell chemistries.

Figure 12A:
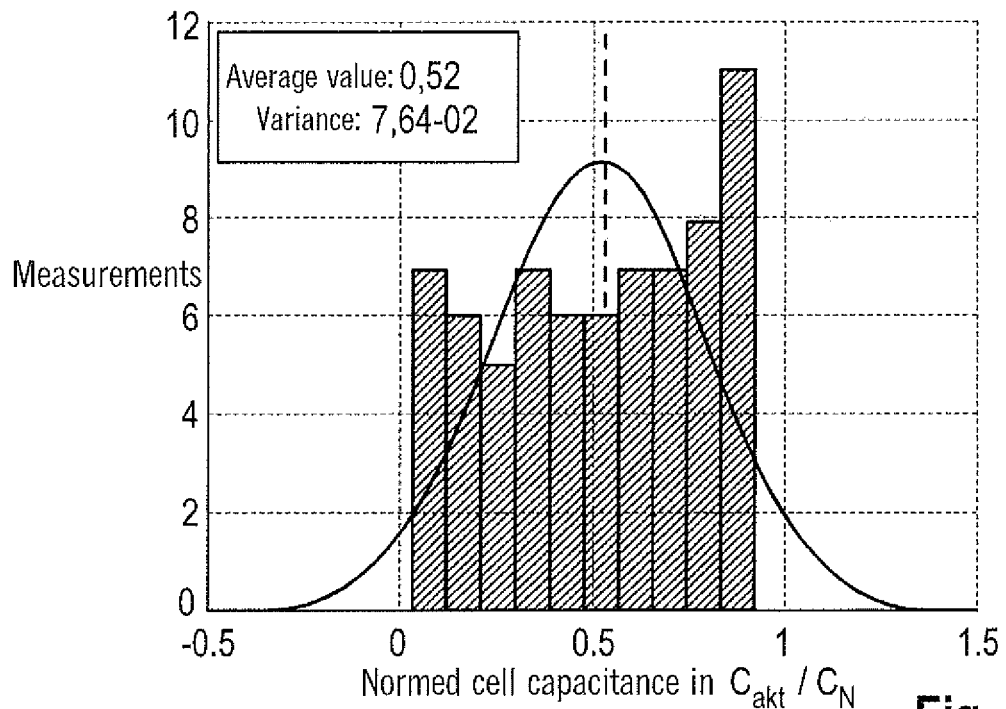
FIGS. 12A to 12D show diagrams to illustrate the variance of the change in a battery cell capacitance in relation to a terminal current in the case of a battery cell.
Figure 12B:
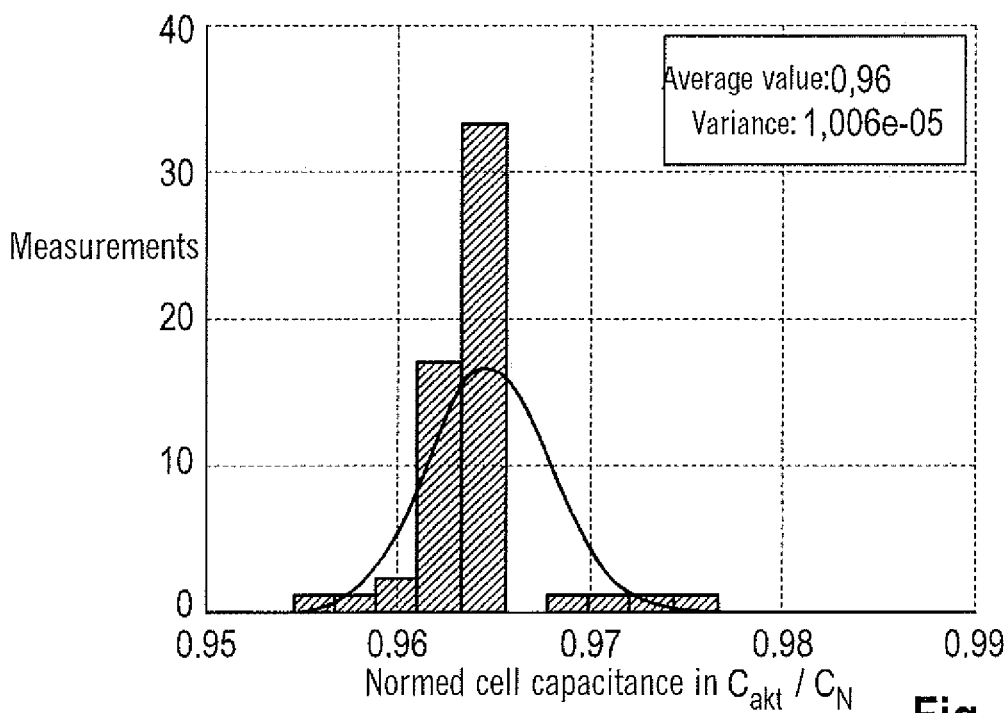
Figure 12C:
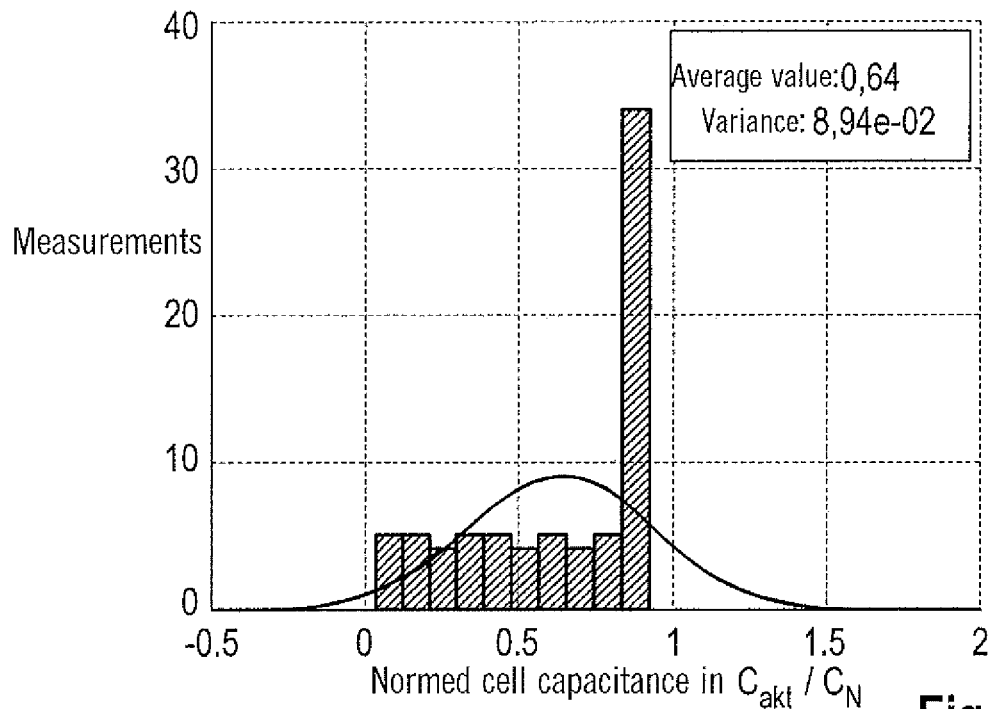
Figure 12D:
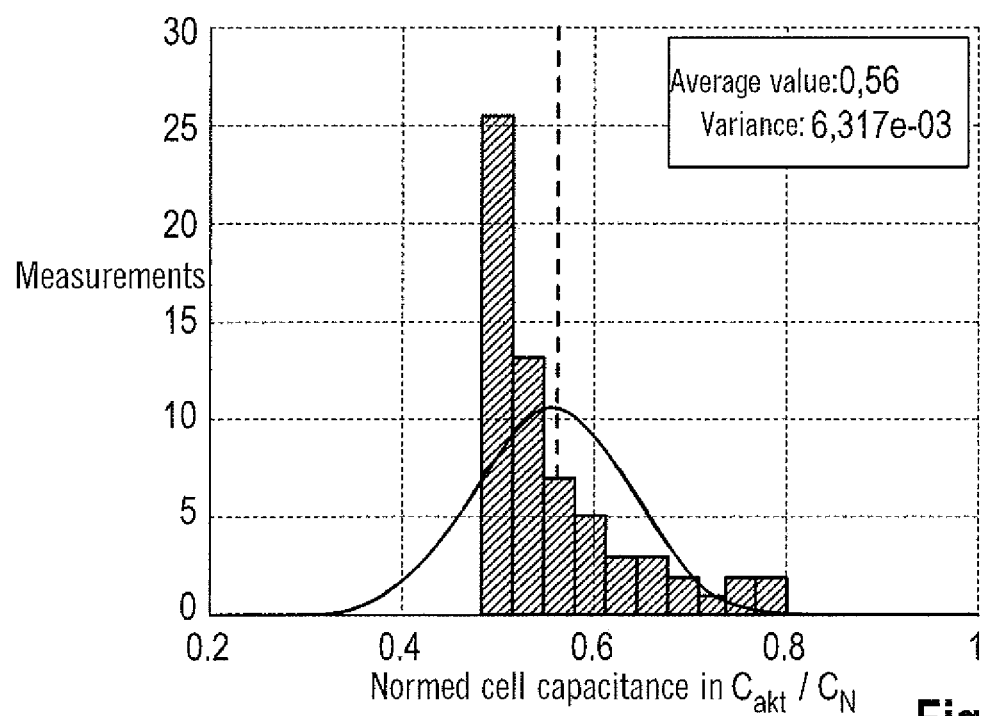

FIG. 12A shows a capacitance variance in the case of an NMC battery. FIG. 12B shows a capacitance variance in the case of an LFP battery. FIG. 12C shows a capacitance variance in the case of an NCA battery and FIG. 12D shows a capacitance variance in the case of an LTO battery.

Since the variance is present in dependence upon the terminal current $I_{KL}$ as a multiple of the original cell capacitance after the production C0, the difference in the terminal current can be used for the cycle period:

$$r_1 = \left(\frac{I_{KL}(t_2)}{C_0} - \frac{I_{KL}(t_1)}{C_0}\right)\sigma_{C_n} \quad (11)$$

The discrete noise modelling produces the following:

$$r_{1_k} = \left(\frac{u_k}{C_0} - \frac{u_{k-1}}{C_0}\right)\sigma_{C_0} \quad (12)$$

FIGS. 10A to 10D show that the two cell chemistries NCA and NMC hardly differ and the LFP and LTO chemistry includes strong fluctuations. An LFP battery cell displays the slightest noise behaviour. This means that the cell capacitance of the battery cell BZ changes much less when using this cell chemistry than in the case of other cell chemistries. LTO battery cell chemistry lies therebetween. For the adaptation of the filter to the respective application the cell chemistry can be selected and the noise behaviour thereof can be considered accordingly.

In the case of a preferred embodiment of the device 1 in accordance with the invention and of the method in accordance with the invention, stability monitoring of the dual Kalman filter 2 additionally takes place. This preferably takes place on the basis of a covariance behaviour of the battery cell states BZZ and of a covariance behaviour of the battery cell parameters BZP. This stability analysis is based on the fact that, in the case of a threat of instability, the covariance of the corresponding battery cell state BZZ or battery cell parameter BZP increases although this would actually have to decrease when filter excitation is present. This happens long before the respective value of the battery cell state BZZ or battery cell parameter BZP assumes a non-plausible value.

In order to use the behaviour of the covariance of each battery cell state BZZ and of each battery cell parameter BZP to deduce whether an erroneous adaptation or an error event is possibly present, which could lead to instability of the dual Kalman filter 2, the correct behaviour of the covariance is examined. In so doing, the diagonal entries of a covariance matrix of the battery cell states BZZ and of the battery cell parameters BZP are preferably used since these represent the autocorrelation of the estimation error of each battery cell state BZZ or battery cell parameter BZP. The individual entries represent a measurement of the quality of the present estimation. The smaller the entries or diagonal entries of the covariance matrix, the more precise the present estimation of the dual Kalman filter 2. In order to evaluate the entries a reference variable is used. Its absolute value does not represent a statement relating to the correction mode of function of the dual Kalman filter 2. On the contrary, the change in this reference variable in comparison with the preceding values is a measure of the correct mode of operation, i.e. if the covariance falls, the error in the estimation becomes smaller, whereas, if the covariance rises, it is highly probable that the error in the estimation will also rise.

In order to examine or analyse the general behaviour of the covariance, its progression is preferably firstly examined based upon a linear Kalman filter. For this purpose, constant values can be assumed for the matrices A, B, C which are variable over time and for the noise terms. The covariance P also does not depend upon the inputs of the dual Kalman filter 2, whereby the progression thereof can be performed independently of the input variables.

FIG. 13 illustrates the progression of the two diagonal values of the covariance matrix P. FIG. 13 shows the theoretical progression of the covariance of the two battery cell states $U_d$, SOC, i.e. the diffusion voltage and the state of charge of the battery cell BZ. FIG. 13 shows the progression over time of a covariance for these two battery cell states BZZ.

As can be seen in FIG. 13, the two covariance values decrease exponentially and approximate asymptotically an end value. This end value depends upon the noise components n, v.

An increase in the measurement noise n results in a slight increase in the limit value, i.e. a flat progression. An increase in the process noise v results in a direct increase in the limit value and in a slight change in the progression.

Based upon these examinations, for each battery cell state BZZ and for each battery cell parameter BZP, a funnel which is adapted to the covariance behaviour is defined in exponential form. If dynamics are present in the system, the respective covariance P must be located within the specified funnel. As soon as the covariance P departs from the funnel or exceeds the value of the funnel function in the event of sufficient excitation, a threat of instability of the dual Kalman filter 2 can be detected. Then, the adaptation of the respective battery cell state BZZ or battery cell parameter BZP is preferably suspended by the dual Kalman filter 2.

The progression of the covariance P within the funnel function TF is illustrated e.g. in FIG. 14. FIG. 14 shows the progression of the diffusion voltage $U_D$ as the battery cell state BZZ within or below the funnel function TF(t). It is necessary to ensure that there is a sufficient distance between the progression of the funnel function and the correct covariance progression. In the case of a preferred embodiment, the funnel function TF is a funnel function which decreases exponentially and has configurable coefficients a, b, c.

In the case of one possible embodiment, the funnel function TF(t) is in the following form:

$$TF(t)=a \cdot e^{b \cdot t}+C,$$

where the coefficients a, b determine the pitch of the curve and the coefficient c determines the final limit value of the function, where $b<0$, $a>0$ and $c>0$. Since the dual Kalman filter 2 is a non-linear dynamic system, in which even the individual noise terms depend upon specific influence factors, the form of the funnel or the funnel function TF is adapted preferably on the basis of the real reaction of the individual battery cell states BZZ and battery cell parameters BZP.

The method in accordance with the invention and the device 1 in accordance with the invention render it possible to estimate battery cell parameters BZP of the battery cell in a dynamic manner with the battery cell states BZZ. Furthermore, the method in accordance with the invention allows the present battery capacitance to be estimated and to also be taken into consideration in the calculation of the state of charge SOC. Furthermore, the method in accordance with the invention allows the state of charge SOC to be estimated on the basis of the present battery capacitance and not, as was previously incorrectly the case, via the rated capacitance C0 which is indicated in the data sheet of the battery cell. Furthermore, the method in accordance with the invention and the device 1 in accordance with the invention render it possible to specify the noise behaviour on the basis of the characteristic parameter influences of the respective cell chemistry. In this case, it does not have to be readjusted by filter-tuning. Furthermore, it is also possible to take into consideration only the respective cell chemistry, wherein the measurement does not have to be performed separately for various battery cells.

Furthermore, the stability monitoring method in accordance with the invention renders it possible to recognise a threat of instability of each battery cell state BZZ and/or each battery cell parameter BZP early. Therefore, it is possible to suspend the estimation of the respective battery cell state BZZ and battery cell parameter BZP until the detected instability is rectified. This can ensure a stable operation of the dual Kalman filter 2. Furthermore, it is possible to also use the dual Kalman filter 2 as an adaptive filter in battery management systems BMS.

In the case of the method in accordance with the invention, the filter-tuning of the dual Kalman filter 2 is effected with the aid of measurable noise components. This allows a rapid adaptation of the dual Kalman filter 2 to various new battery systems or battery cells BZ. The respective influence variables can be controlled in an exact manner.

The method in accordance with the invention allows the state of charge of a battery cell BZ or of a battery to be determined with high precision. If this battery cell BZ is used e.g. for driving an electric motor of a vehicle, the range prediction for the vehicle is significantly improved thereby.

The detection method in accordance with the invention operates robustly and reliably. It can be flexibly adapted for various systems of battery cell types. The method in accordance with the invention can be implemented with the aid of a dual Kalman filter 2 with a relatively small amount of technical outlay. In the case of one possible embodiment variant, the detection device 1 in accordance with the invention can be integrated in the housing of a battery which includes one or a plurality of battery cells BZ, in order to detect battery cell states BZZ and/or battery cell parameters BZP of the battery cell BZ. The detected battery cell states BZZ and/or detected battery cell parameters BZP can be communicated to a control unit. In dependence upon the detected battery cell parameters BZP and detected battery cell states BZZ, this control unit can actuate a current source in order to charge the battery cell and/or an electric load operated by the battery cell. The detection method in accordance with the invention can be carried out in real time. The battery cell states BZZ and/or battery cell parameters BZP detected in real time can be evaluated in real time and used for closed-loop and open-loop processes e.g. in an electric motor or a photovoltaic installation. In a preferred embodiment, the detection device 1 in accordance with the invention has integrated stability monitoring and is automatically deactivated when there is a threat of instability.

According to a further aspect, the invention provides a battery management system BMS for a battery which consists of one or a plurality of battery cells, having a detection device 1 in accordance with the invention for detection of battery cell states BZZ and/or battery cell parameters BZP.

According to a further aspect, the invention provides an electric vehicle with such a battery management system and one or a plurality of battery cells BZ.

According to a further aspect, the invention provides a photovoltaic installation with rechargeable battery cells BZ and a battery management system BMS, said installation having a detection device 1 in accordance with the invention.

The method in accordance with the invention and the device 1 in accordance with the invention for detection of battery cell states BZZ and/or battery cell parameters BZP can be used for multiple purposes and can be used with any rechargeable battery cells BZ or energy stores.

The invention claimed is:

1. A method for monitoring a stable convergence behaviour of a Kalman filter, which estimates states and/or parameters of a battery cell of a battery cell energy storage system and provides a covariance behaviour in terms of at least one state and/or parameter of the battery cell, comprising the steps:
    comparing the covariance behavior with a corresponding desired covariance behaviour of the state and/or parameter;
    automatically deactivating the Kalman filter for each state and/or each parameter of the battery cell, of which the covariance behaviour exceeds the corresponding desired covariance behaviour, wherein the desired covariance behaviour has a funnel function TF(t) decreasing over time (t), wherein $TF(t)=a \cdot e^{bt}+c$ with configurable coefficients a, b, c;
    determining first noise components of a state estimator, formed as a first Kalman filter of a dual Kalman filter, and determining second noise components of a parameter estimator, formed as a second Kalman filter of the dual Kalman filter, on the basis of a characteristic parameter behaviour of the battery cell in relation to at least one battery cell characteristic variable of the battery cell, wherein a state vector of the state estimator of the dual Kalman filter includes the states of the battery cell and a state vector of the parameter estimator of the dual Kalman filter includes the parameters of the battery cell;
    adapting the states and the parameters of the battery cell to a specified battery model of the battery cell by means of the dual Kalman filter on the basis of the determined first and second noise components;
    controlling a loading of the battery cell on the basis of the estimated states of the battery cell and the estimated parameters of the battery cell, and
    outputting to a control unit the states of the battery cell which are adapted by the state estimator of the dual Kalman filter, and the parameters of the battery cell which are adapted by the parameter estimator of the dual Kalman filter for controlling a load connected to the battery cell, and/or for controlling a current source connected to the battery cell.

2. The method as claimed in claim 1, wherein:
the states of the battery cell include a state of charge of the battery cell and a diffusion voltage of the battery cell, wherein the parameters of the battery cell include an internal resistance of the battery cell, a rated capacitance of the battery cell, a diffusion resistance of the battery cell and a diffusion capacitance of the battery cell, and
the at least one battery cell characteristic variable includes a loading characteristic variable of the battery cell, a temperature of the battery cell and/or an ageing characteristic variable of the battery cell.

3. The method as claimed in claim 1, wherein:
the determined first and second noise components include a process noise and/or a measurement noise, and
the process noise includes a process noise of the states of the battery cell and/or a process noise of the parameters of the battery cell.

4. The method as claimed in claim 1, wherein:
the characteristic parameter behaviour of the battery cell indicates for each of the parameters of the battery cell its average value and/or its variance in relation to each of the states of the battery cell, and
the characteristic parameter behaviour of the battery cell is determined on the basis of measurement variables detected by means of sensors, which measurement variables include a terminal current, a terminal voltage and/or a temperature of the battery cell.

5. The method as claimed in claim 1, further comprising the steps of:
    determining a process noise of a parameter of the battery cell in dependence upon read-out characteristic parameter behaviour of the battery cell in relation to a state of the battery cell and in dependence upon a change in said state over time, and
    determining a process noise of a state of the battery cell in dependence upon read-out parameter behaviour of the battery cell in relation to at least one parameter of the battery cell.

6. The method as claimed in claim 1, further comprising the steps of:
    calculating for each measurement variable detected by means of sensors a measurement variable noise on the basis of an average value and/or a variance of a noise behaviour of the corresponding measurement variable sensor in relation to the measurement variable which is read out from a data store, and
    summing the calculated measurement variable noise of all of the measurement variables in order to determine a measurement noise.

7. The method as claimed in claim 1, further comprising the steps of:
    monitoring a stability of the dual Kalman filter, and
    as soon as a threat of instability of the dual Kalman filter is recognized, suspending the adaptation of the respective states by means of the state estimator of the dual Kalman filter, and the adaptation of the respective parameters by means of the parameter estimator of the dual Kalman filter, wherein the stability of the dual Kalman filter is monitored on the basis of a covariance behaviour of the states and a covariance behaviour of the parameters.

8. The method as claimed in claim 1, further comprising the step of comparing the covariance behaviour of a state of the battery cell and/or the covariance behaviour of a parameter of the battery cell of the dual Kalman filter with an associated stored desired covariance behaviour.

9. The method as claimed in claim 8, further comprising:
    as soon as the covariance behaviour of the state of the battery cell exceeds the stored associated desired covariance behaviour of the respective state of the battery cell suspending the adaptation of the state of the battery cell by the state estimator of the dual Kalman filter; and
    as soon as covariance behaviour of the parameter of the battery cell exceeds the stored associated desired covariance behaviour of the respective parameter of the battery cell suspending the adaptation of the parameter of the battery cell by the parameter estimator of the dual Kalman filter.

10. The method as claimed in claim 1, wherein the desired covariance behaviour is stored in a data store and comprises the funnel function TF(t) decreasing exponentially over time, the coefficients of which (a, b, c) are configured, wherein $TF(t) = a \cdot e^{bt} + c$ with $b<0$, $a>0$ and $c>0$.

11. A stability monitoring device for monitoring a stable convergence behaviour of a monitored Kalman filter, which estimates states and/or parameters of a battery cell of a battery cell energy storage system wherein the device is configured and operable to:
- compare a convergence behaviour provided by the Kalman filter—in terms of at least one state and/or parameter of the battery cell with a corresponding desired covariance behaviour of the state and/or parameter;
- automatically deactivate the monitored Kalman filter for each state and/or each parameter of the battery cell of which the covariance behaviour exceeds the corresponding desired covariance behaviour, wherein the desired covariance behaviour has a funnel function TF(t) decreasing over time (t), wherein $TF(t) = a \cdot e^{bt} + c$ with configurable coefficients a, b, c;
- determine first noise components of a state estimator, formed as a first Kalman filter of a dual Kalman filter, and determine second noise components of a parameter estimator, formed as a second Kalman filter of the dual Kalman filter, on the basis of a characteristic parameter behaviour of the battery cell in relation to at least one battery cell characteristic variable of the battery cell, wherein a state vector of the state estimator of the dual Kalman filter includes the states of the battery cell and a state vector of the parameter estimator of the dual Kalman filter includes the parameters of the battery cell;
- adapt the states and the parameters of the battery cell to a specified battery model of the battery cell by means of the dual Kalman filter on the basis of the determined first and second noise components;
- control a loading of the battery cell on the basis of the estimated states of the battery cell and the estimated parameters of the battery cell, and
- output to a control unit the states of the battery cell which are adapted by the state estimator of the dual Kalman filter, and the parameters of the battery cell which are adapted by the parameter estimator of the dual Kalman filter for controlling a load connected to the battery cell, and/or for controlling a current source connected to the battery cell.

12. The stability monitoring device as claimed in claim 11, wherein the monitored Kalman filter is selected from the group consisting of an extended Kalman filter, an unscented Kalman filter, a square-root unscented Kalman filter, a central difference Kalman filter and a dual Kalman filter.

13. The stability monitoring device as claimed in claim 11, wherein the desired covariance behaviour is stored in a data store.

* * * * *